(12) United States Patent
Sako et al.

(10) Patent No.: US 8,379,451 B2
(45) Date of Patent: Feb. 19, 2013

(54) SEMICONDUCTOR MEMORY DEVICE

(75) Inventors: Mario Sako, Yokohama (JP); Takahiro Suzuki, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/235,392

(22) Filed: Sep. 18, 2011

(65) Prior Publication Data
US 2012/0243320 A1 Sep. 27, 2012

(30) Foreign Application Priority Data

Mar. 25, 2011 (JP) ................ 2011-068668

(51) Int. Cl.
*G11C 11/34* (2006.01)
*G11C 16/04* (2006.01)
*G11C 7/10* (2006.01)

(52) U.S. Cl. ......... 365/185.17; 365/185.09; 365/185.22; 365/189.08; 365/63

(58) Field of Classification Search ............. 365/185.17, 365/189.08
See application file for complete search history.

(56) References Cited

U.S. PATENT DOCUMENTS

| | | | |
|---|---|---|---|
| 6,421,276 B1 * | 7/2002 | Goltman ................ | 365/185.22 |
| 2011/0032767 A1 * | 2/2011 | Tanaka et al. ............ | 365/185.22 |
| 2011/0205806 A1 | 8/2011 | Yoshihara et al. | |
| 2012/0224429 A1 * | 9/2012 | Moschiano et al. ..... | 365/185.19 |

FOREIGN PATENT DOCUMENTS

JP 2010-176761 8/2010

OTHER PUBLICATIONS

U.S. Appl. No. 12/884,721, filed Sep. 17, 2010, Masahiro Yoshihara, et al.

* cited by examiner

*Primary Examiner* — Ly D Pham
(74) *Attorney, Agent, or Firm* — Oblon, Spivak, McClelland, Maier & Neustadt, L.L.P.

(57) ABSTRACT

According to one embodiment, a semiconductor memory device includes a plurality of memory cells, a logic gate chain, and a counter. The memory cells are capable of retaining data and are associated with the columns. The logic gate chain includes a plurality of logic gates associated with the columns. Each of the logical gates outputs a logical level to a next-stage logical gate in the series connection. The logic level indicates presence or absence of verify-failure in the associated column. The counter counts the number of output times of the logic level indicating the presence of the verify-failure in a final-stage logic gate of the series connection. A content indicated by the logic level output from each of the logic gates is inverted at a boundary of the logic gate associated with the column having the verify-failure in the logic gate chain.

10 Claims, 14 Drawing Sheets

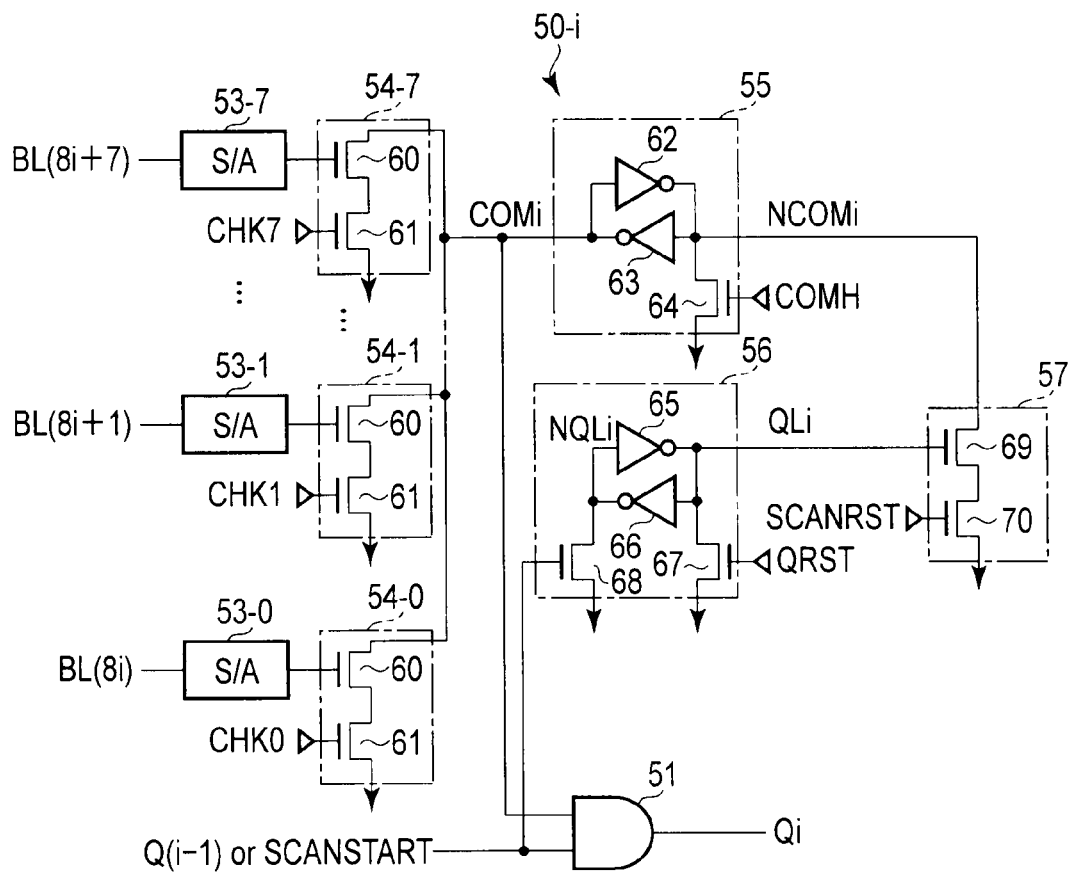
F I G. 3

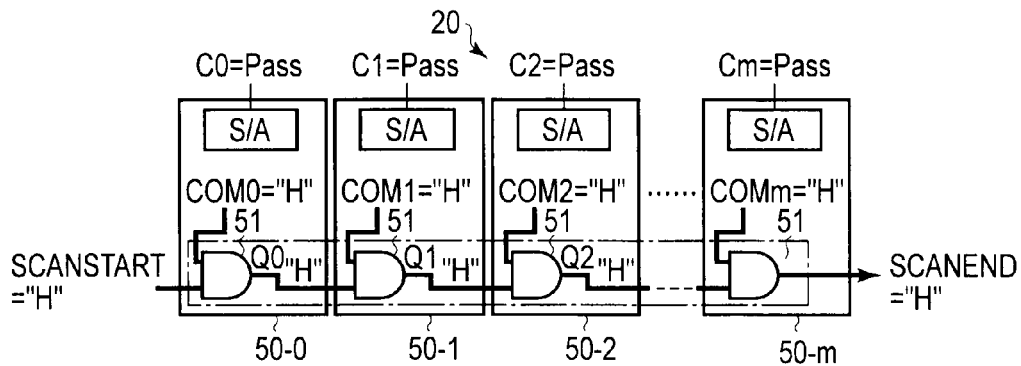
F I G. 6
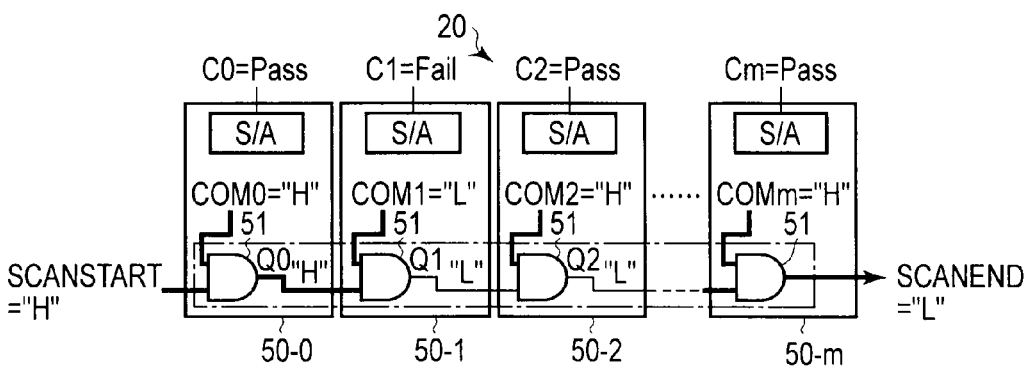
F I G. 7
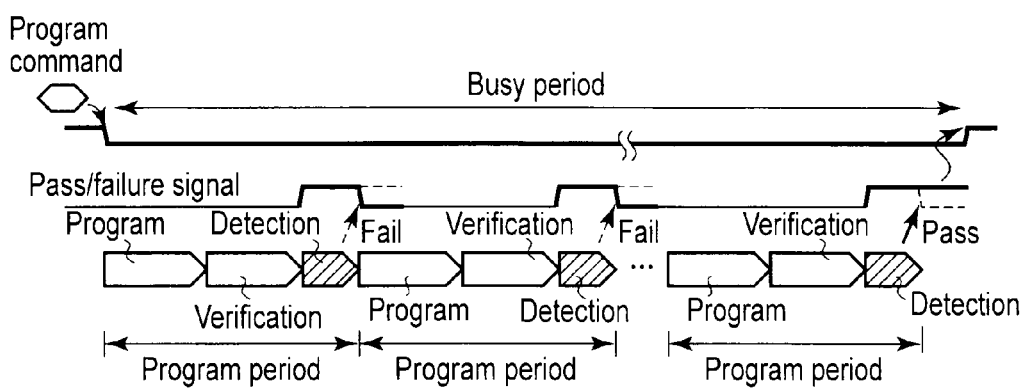
F I G. 8

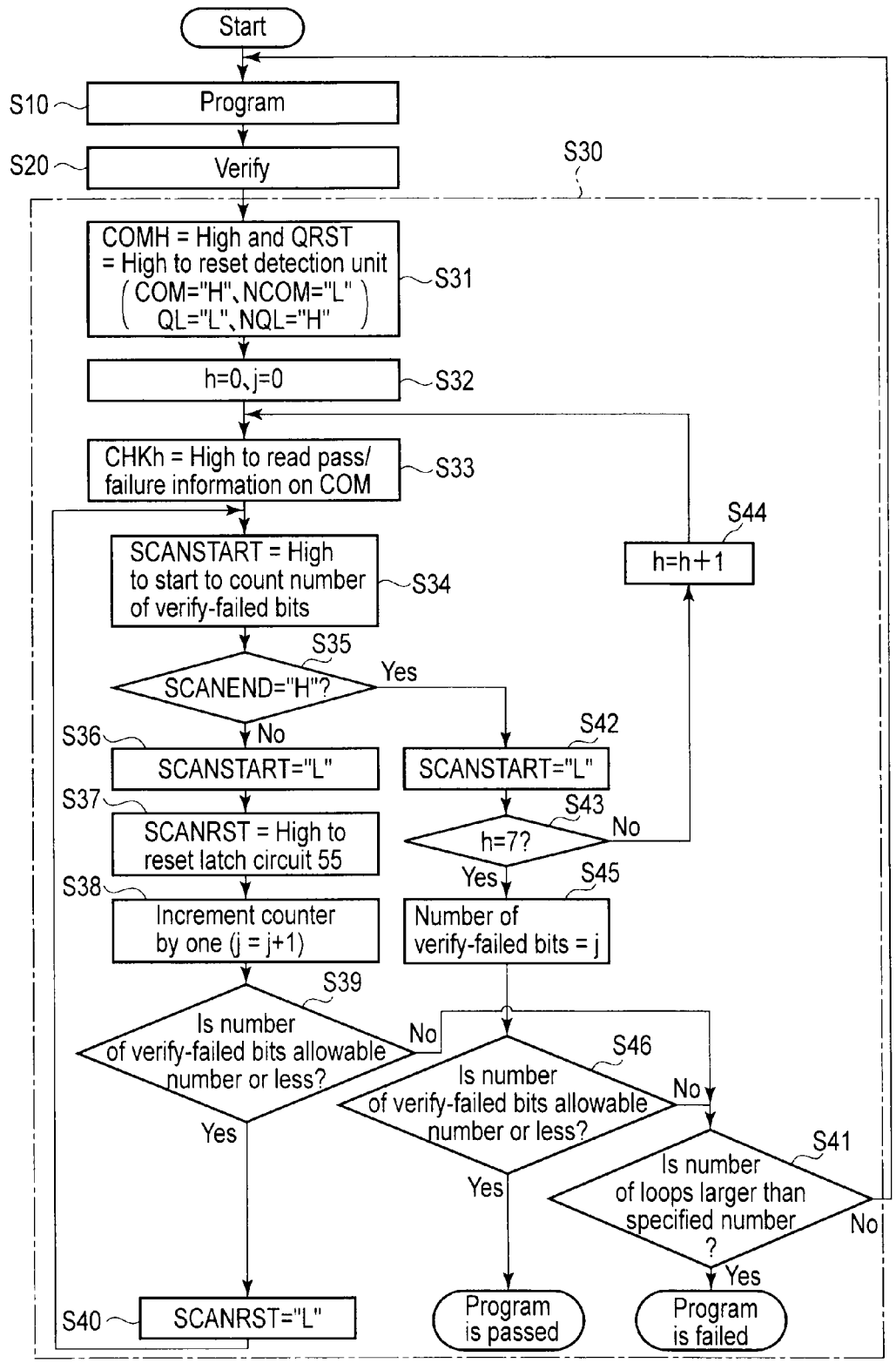
F I G. 9

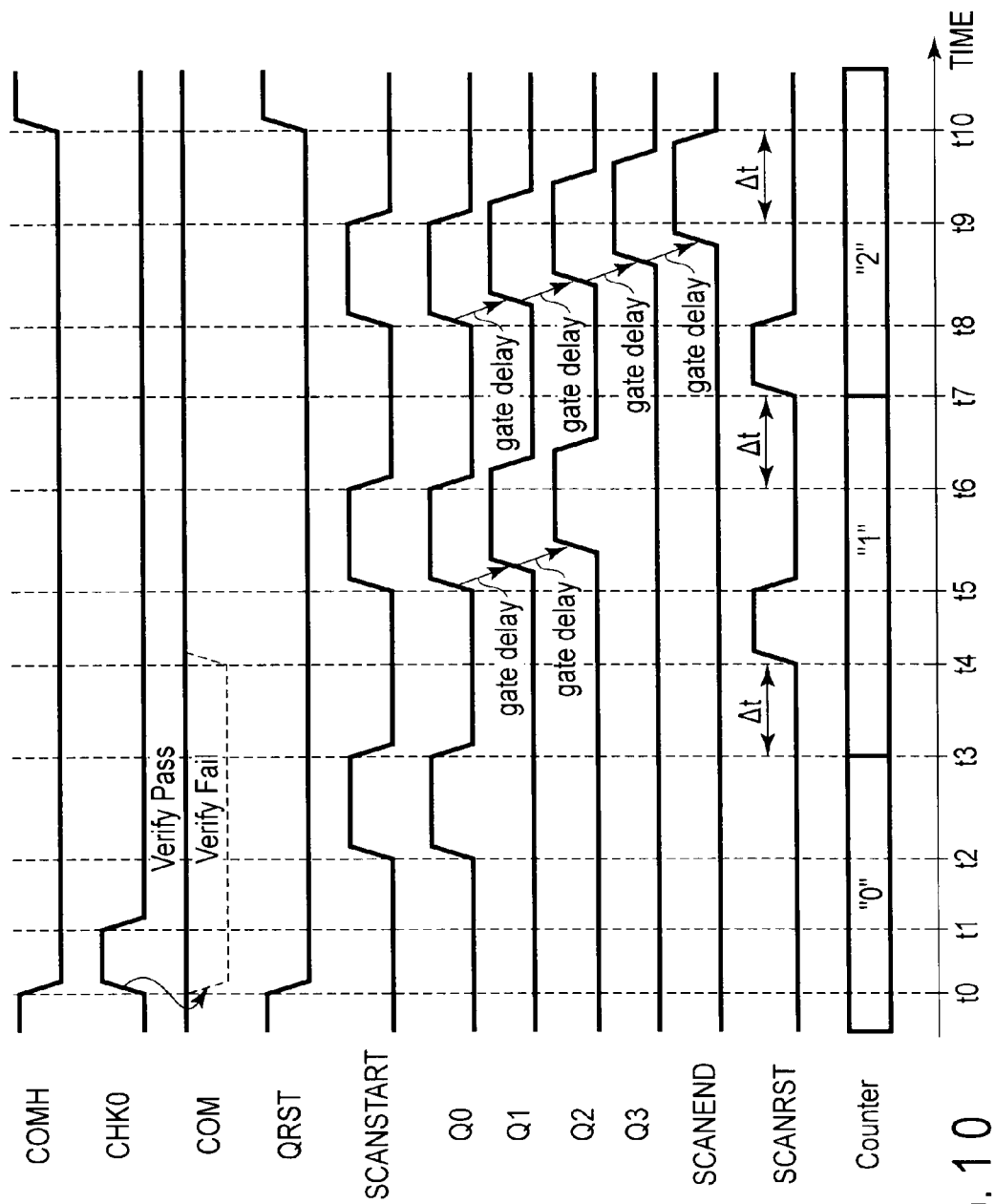
F I G. 10

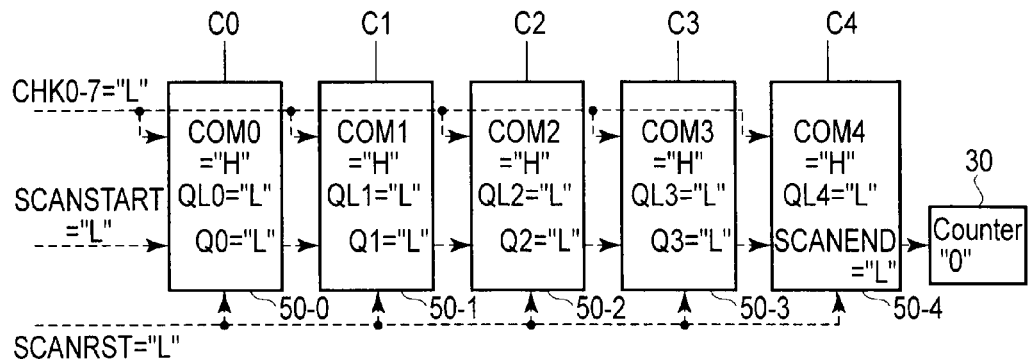
F I G. 1 1
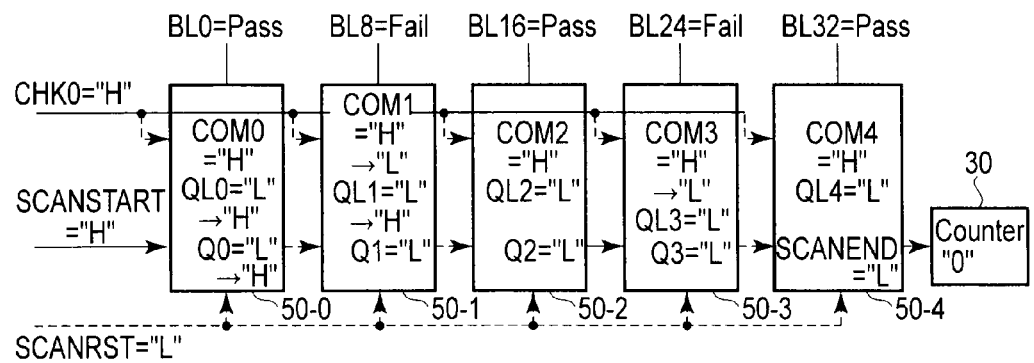
F I G. 1 2
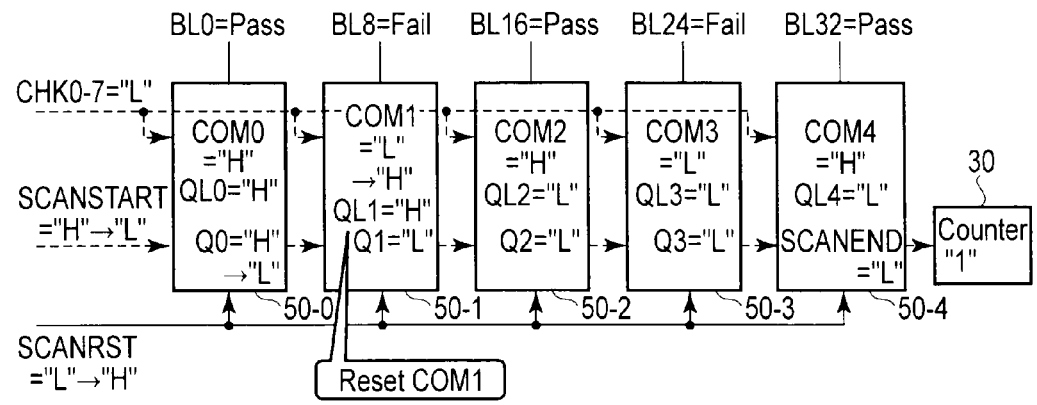
F I G. 1 3

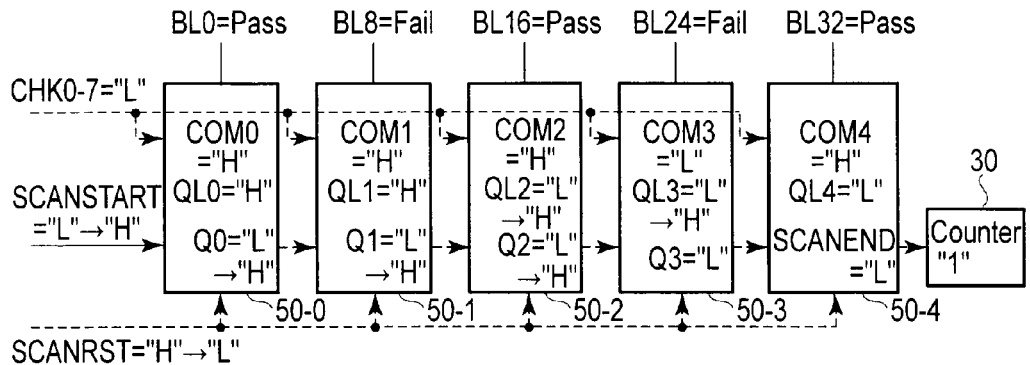
F I G. 14
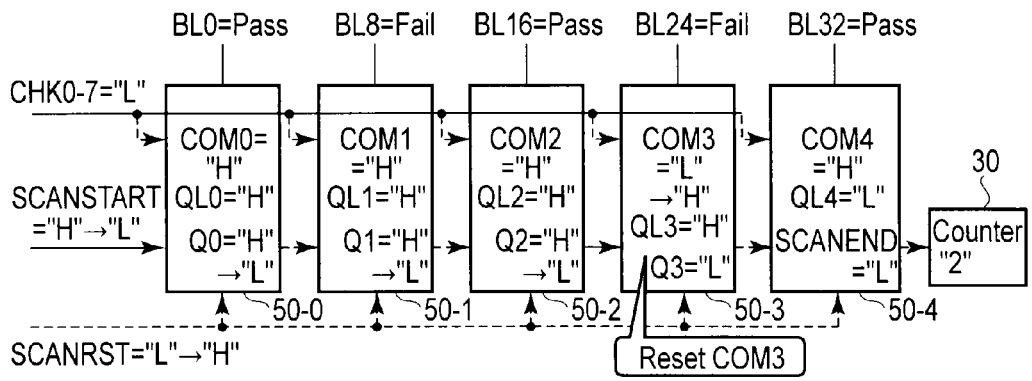
F I G. 15
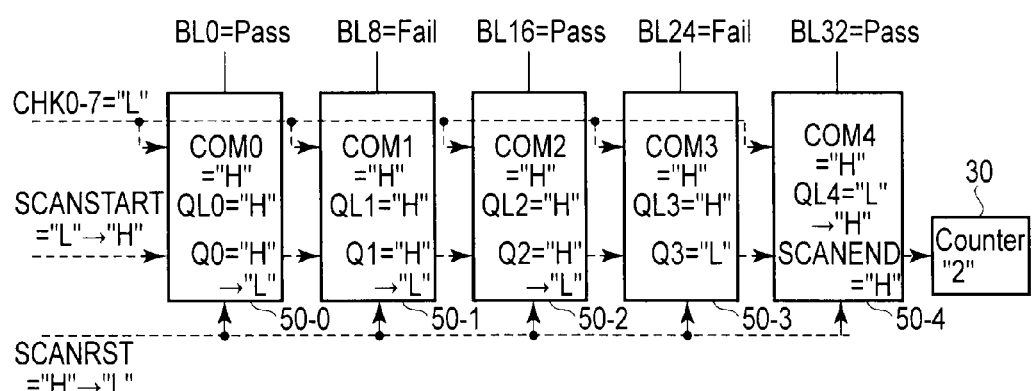
F I G. 16

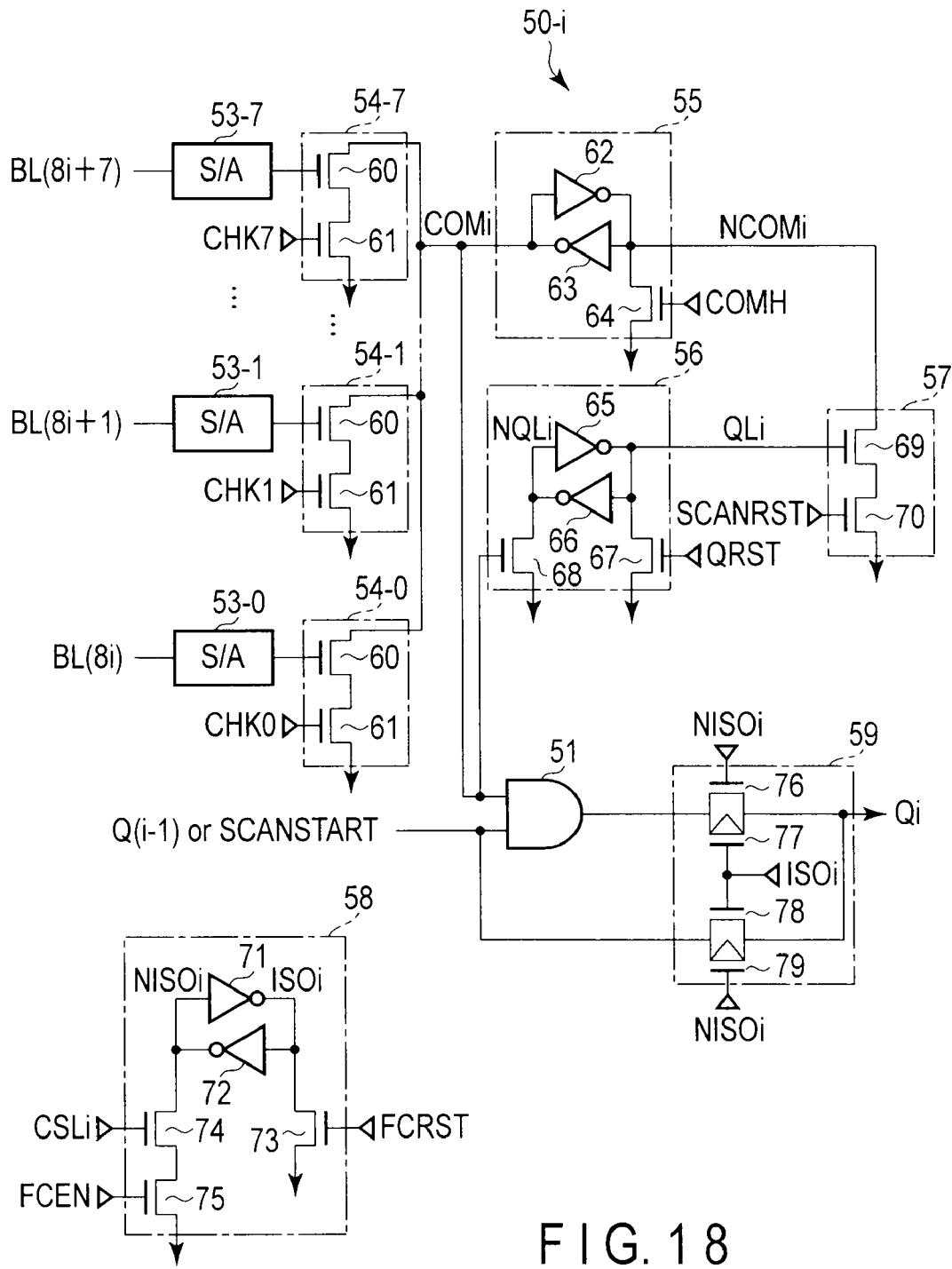
F I G. 18

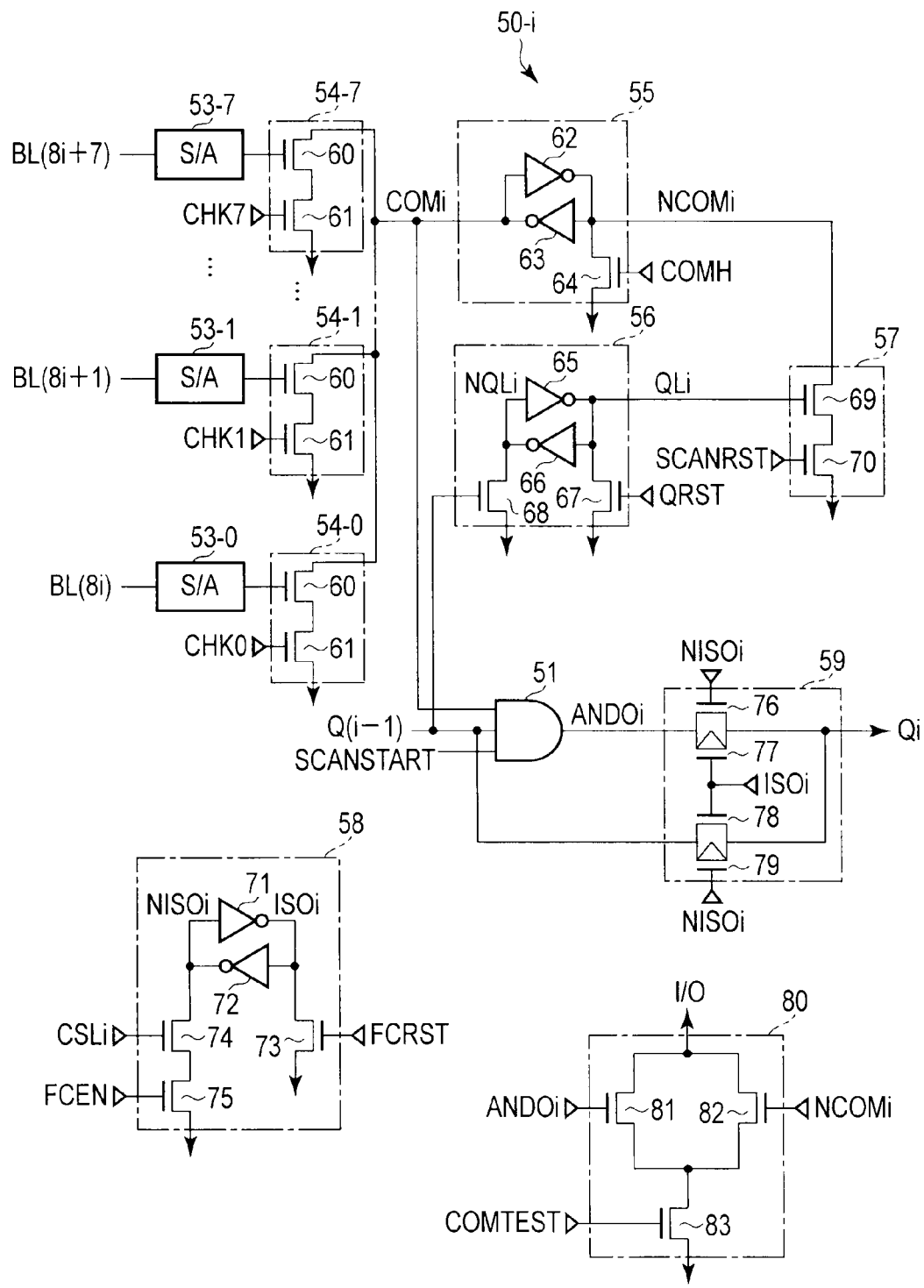
F I G. 20

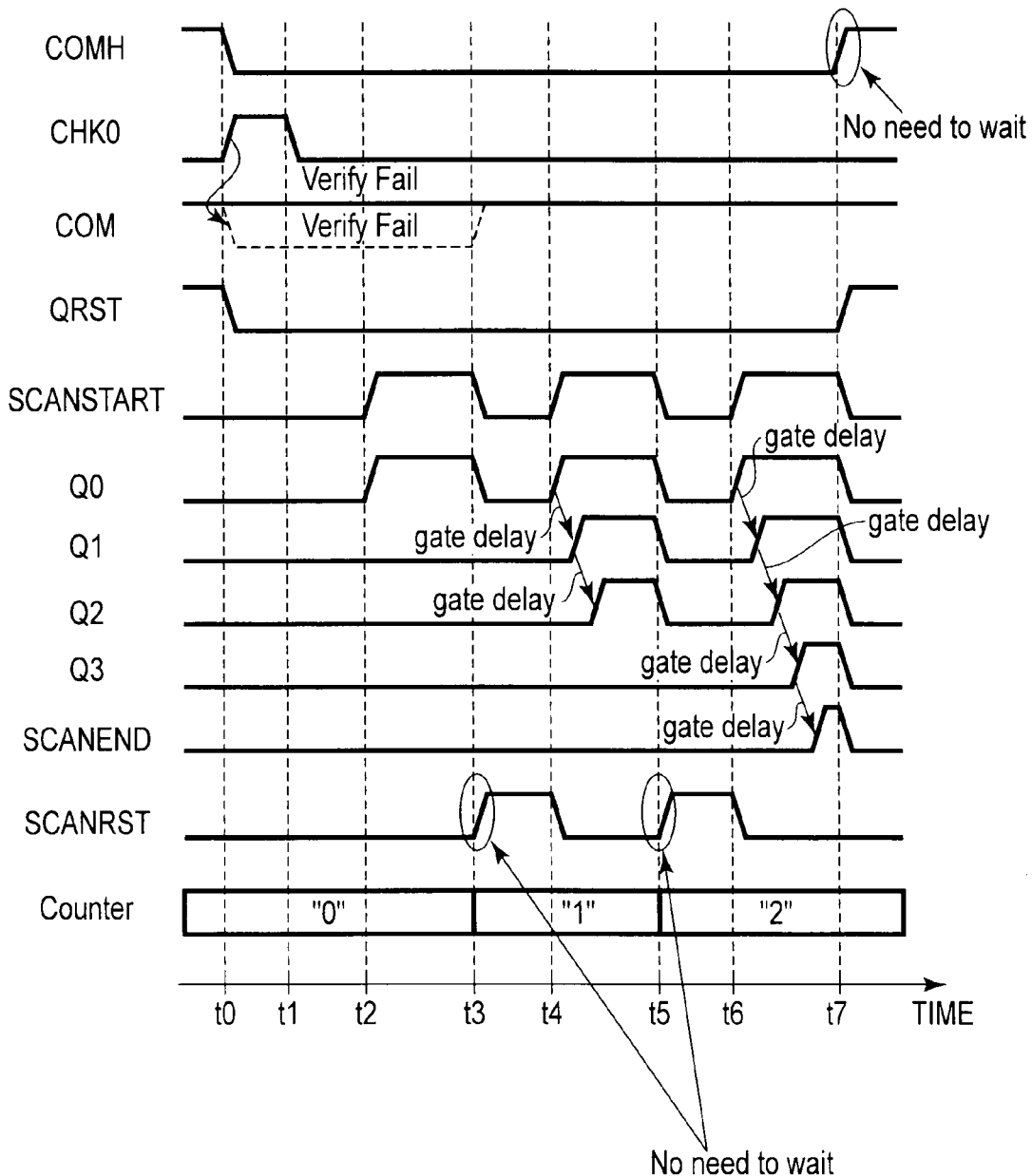
F I G. 21

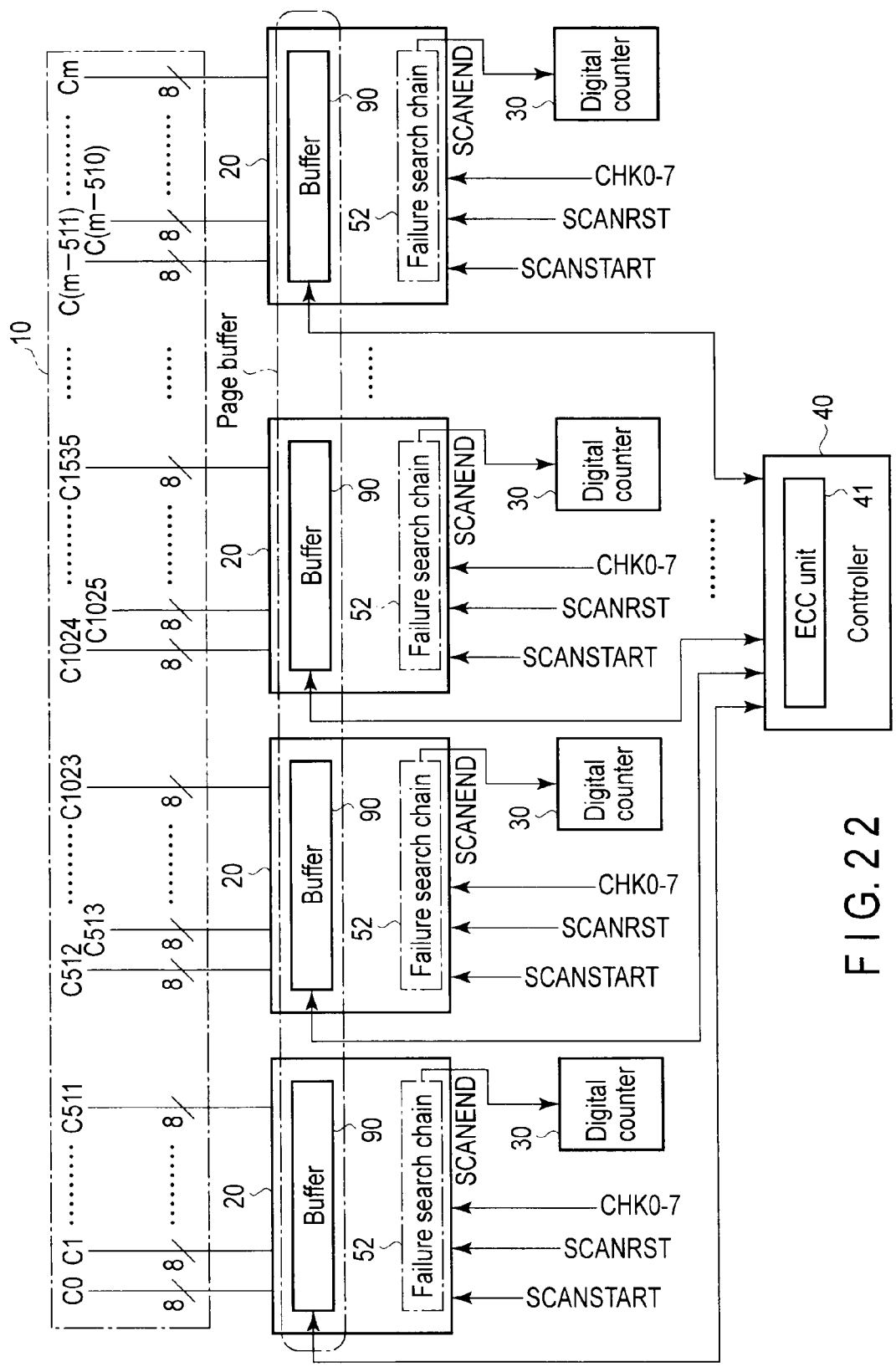
F I G. 22

US 8,379,451 B2

SEMICONDUCTOR MEMORY DEVICE

CROSS-REFERENCE TO RELATED APPLICATIONS

This application is based upon and claims the benefit of priority from prior Japanese Patent Application No. 2011-068668, filed Mar. 25, 2011, the entire contents of which are incorporated herein by reference.

FIELD

Embodiments described herein relate generally to a semiconductor memory device.

BACKGROUND

In a NAND flash memory of the related art, verification is performed in writing data. There is well known a function (hereinafter referred to as a pseudo-pass function) of ending a program sequence when the number of verify-failed bits is a predetermined number or less.

A circuit technology of counting the number of verify-failed bits is required to adopt the pseudo-pass function.

BRIEF DESCRIPTION OF THE DRAWINGS

FIG. 3 to FIG. 5 are circuit diagrams of a detector according to the first embodiment;

FIG. 6 and FIG. 7 are circuit diagrams of the detector according to the first embodiment;

FIG. 8 is a timing chart of a write operation according to the first embodiment;

FIG. 9 is a flowchart of the write operation according to the first embodiment;

FIG. 10 is a timing chart of various signals during the write operation according to the first embodiment;

FIG. 11 to FIG. 16 are block diagrams of the flash memory according to the first embodiment;

FIG. 18 is a circuit diagram of a detector and a latch circuit according to a second embodiment;

FIG. 20 is a circuit diagram of a detector, a latch circuit, and a test circuit according to a fourth embodiment;

FIG. 21 is a timing chart of various signals during a write operation according to the fourth embodiment; and FIG. 22 is a block diagram of a flash memory according to a fifth embodiment.

DETAILED DESCRIPTION

In general, according to one embodiment, a semiconductor memory device includes: a plurality of memory cells; a logic gate chain; and a counter. The each of memory cells is capable of retaining data and is associated with one of columns. The logic gate chain includes a plurality of logic gates each of which is associated with one of the columns. Each of the logical gates outputs a logical level to a next-stage logical gate in the series connection. The logic level indicates presence or absence of verify-failure in the associated column. The counter counts the number of output times of the logic level indicating the presence of the verify-failure in a final-stage logic gate of the series connection. A content indicated by the logic level output from each of the logic gates is inverted at a boundary of the logic gate associated with the column having the verify-failure in the logic gate chain.

First Embodiment

A semiconductor memory device according to a first embodiment will be described by taking a NAND flash memory for example.

1. Entire Configuration of NAND Flash Memory

Figure 1:
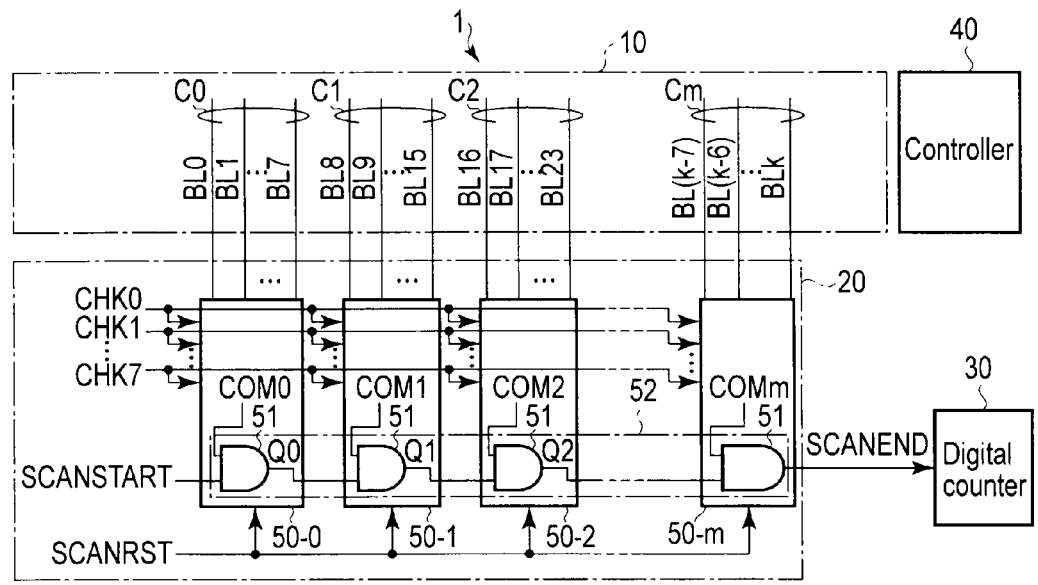
FIG. 1 is a block diagram of a flash memory according to a first embodiment.

FIG. 1 is a block diagram of a NAND flash memory according to the first embodiment. As illustrated in FIG. 1, a NAND flash memory 1 roughly includes a memory cell array 10, a detector 20, a digital counter 30, and a controller 40. Each component of the NAND flash memory 1 will be described below.

1.1 Memory Cell Array 10

Figure 2:
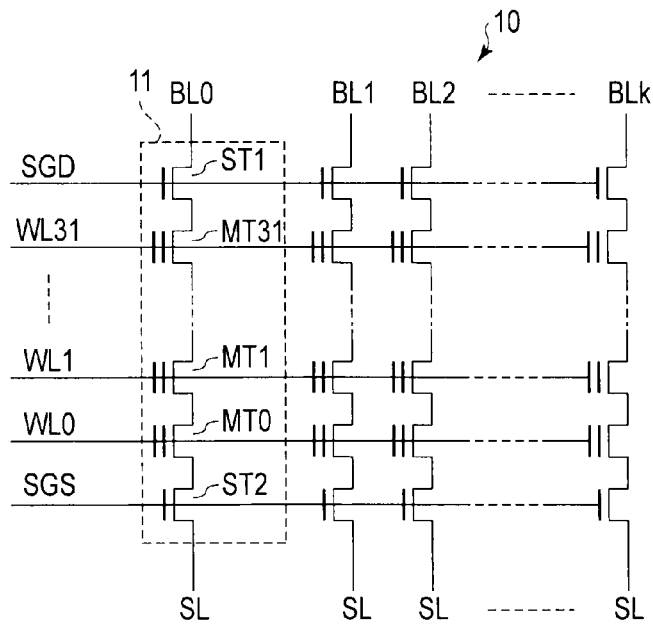
FIG. 2 is a circuit diagram of a memory cell array according to the first embodiment.

The memory cell array 10 includes a plurality of memory cell transistors each of which can retain data. FIG. 2 is a circuit diagram of the memory cell array 10. As illustrated in FIG. 2, the memory cell array 2 includes a plurality of NAND cells 11. For example, each of the NAND cells 11 includes 32 memory cell transistors MT (MT0 to MT 31) and selection transistors ST1 and ST2. The memory cell transistor MT has a stacked gate structure including a charge accumulation layer (for example, a floating gate) that is formed on a semiconductor substrate with a gate insulating film interposed therebetween and a control gate that is formed on the charge accumulation layer with an inter-gate insulating film interposed therebetween. The number of memory cell transistors MT is not limited to 32, but it may be 8, 16, 64, 128, or 256. There is no particular limitation to the number of memory cell transistors MT. The charge accumulation layer may be made of an insulator. A source and a drain are shared by the memory cell transistors MT adjacent to each other, current paths of the memory cell transistors MT are connected in series between the selection transistors ST1 and ST2. The drain on one end side of the memory cell transistors MT connected in series is connected to a source of the selection transistor ST1, and the source on the other end side is connected to a drain of the selection transistor ST2.

The control gates of the memory cell transistors MT located in the same row are commonly connected to one of word lines WL (WL0 to WL31), and the gates of the selection transistors ST1 and ST2 located in the same row are commonly connected to select gate lines SGD and SGS, respectively. The drain of the selection transistor ST1 is connected to one of bit lines BL (BL0 to BLk [k is a natural number of 2 or more]), and the source of the selection transistor ST2 is commonly connected to a source line SL.

In the above configuration, one unit called a block is formed by the plurality of NAND cells 11 that share the word line WL and the select gate lines SGD and SGS. Items of data are collectively erased in the memory cell transistors MT in the same block. Items of data are collectively written to the plurality of memory cell transistors MT connected to the same word line WL, and the unit in which the items of data are collectively written to the memory cell transistors MT is called a page.

As illustrated in FIG. 1, for example, 8 adjacent bit lines BL from bit line BL0 makes one unit called a column. In the first embodiment, (m+1) columns C (C0 to Cm) are included in the memory cell array 10 ((m+1) is a natural number of 1 or more). That is, bit lines BL$8i$ to BL($8i$+7) belong to a column Ci (i is an integer of 0 to m).

1.2 Detector 20

The detector 20 will be described below. The detector 20 performs a verification operation and a verify-failed bit detecting operation. As illustrated in FIG. 1, the detector 20 includes (m+1) detection units 50 (50-1 to 50-*m*) that are associated with column Ci, respectively.

The detection unit 50 performs the verification operation in writing and erasing the data. In a subsequent detecting operation, the detection unit 50 temporarily retains information (pass/failure information) indicating whether the associated column Ci passes the verification, and the detection unit 50 outputs the pass/failure information to nodes COM (COM0 to COMm). Node COM is shared by the plurality of bit lines BL belonging to the associated column Ci. Which bit line BL the pass/failure information is output to the node COM is selected by control signal CHK (CHK0 to CHK7) for each column Ci. The control signal CHK is shared by detection units 50-0 to 50-*m*. The pass/failure information on bit line BL($8i$+h) (h is an integer of 0 to 7) belonging to each column Ci is output to node COMi by asserting the control signal CHKh.

Each detection unit 50 includes an AND gate 51 that outputs a signal Q (Q0, Q1, Q2, . . . ), and the AND gates 51 are connected in series. That is, the AND gate 51 of detection unit 50-*i* performs AND operation of the signal at node COMi and output Q(i−1) of the preceding AND gate 51, and outputs an operation result as signal Qi to the subsequent AND gate 51. Hereinafter a set of AND gates connected in series is referred to as a failure search chain 52.

The AND gate 51 at the first stage in the failure search chain 52 performs the AND operation of node COM0 and a control signal SCANSTART. The AND gate 51 at the final stage outputs the operation result as a signal SCANEND.

Hereinafter that the column C does not pass the verification is referred to as failure or verify-failure. A configuration and an operation of the detector 20 are described in detail later.

1.3 Digital Counter 30

The digital counter 30 (hereinafter simply referred to as a counter 30) counts the number of verify-failed bits in the memory cell array 10 during the detecting operation. In counting the number of verify-failed bits, the counter 30 performs a count operation based on signal SCANEND.

1.4 Controller 40

The controller 40 controls the entire operation of the NAND flash memory 1. More specifically, the controller 40 issues a command to each circuit block in the NAND flash memory 1 to perform processing necessary to read, write, and erase the data. For example, the controller 40 issues signals CHK, SCANSTART, and SCANRST to the detector 20 during the detecting operation.

The controller 40 includes an error checking and correcting (ECC) circuit, and the controller 40 generates a syndrome from a parity to detect and correct an error in reading the data. In writing the data, the controller 40 generates the parity based on the write data. The controller 40 also includes a row decoder to apply a necessary voltage to the word line WL and the select gate lines SGD and SGS in writing, reading, and erasing the data.

2. Detailed Detector 20

The detailed detector 20 will be described below.

2.1 Configuration of Detection unit 50

The detailed configuration of the detection unit 50 will be described with reference to FIG. 3. FIG. 3 is a circuit diagram of one of detection units 50-*i* (i is an integer of 0 to m). As illustrated in FIG. 3, detection unit 50-*i* includes the AND gate 51, a sense amplifier 53 (53-0 to 53-7), a selection unit 54 (54-0 to 54-7), latch circuits 55 and 56, and a reset unit 57.

The sense amplifier 53 is provided in each bit line BL. In the first embodiment, because each column C includes 8 bit lines BL, each detection unit 50 includes 8 sense amplifiers 53-0 to 53-7. The sense amplifiers 53-0 to 53-7 are associated with bit lines BL($8i$) to BL($8i$+7), respectively.

In reading the data, the sense amplifier 53 senses and amplifies the data read on the associated bit line BL, and temporarily retains the data. In writing the data, the sense amplifier 53 temporarily retains program data, and transfers the program data to the associated bit line BL. In the verification, the sense amplifier 53 performs the verification to the associated bit line BL, temporarily retains the pass/failure information on the bit line BL, and outputs the pass/failure information to the selection unit 54.

The selection unit 54 is provided in each sense amplifier 53. That is, each detection unit 50-*i* includes 8 selection units 54-0 to 54-7 associated with the sense amplifiers 53-0 to 53-7. Each selection unit 54 has a function of transferring the pass/failure information on the associated sense amplifier 53 to node COMi.

That is, each selection unit 54 includes n-channel MOS transistors 60 and 61. The drain of MOS transistor 60 is connected to node COMi, and the source of MOS transistor 60 is connected to the drain of MOS transistor 61. The source of MOS transistor 61 is grounded. The pass/failure information output from the sense amplifiers 53-0 to 53-7 are provided to the gates of MOS transistors 60 of selection units 54-0 to 54-7, respectively. Signals CHK0 to CHK7 are provided to the gates of MOS transistors 61 of selection units 54-0 to 54-7.

Latch 55 retains the pass/failure information transferred to node COMi. That is, latch 55 includes inverters 62 and 63 and an n-channel MOS transistor 64. An input node of the inverter 62 is connected to node COMi, and an output node of the inverter 62 is connected to a node NCOMi. The input node of the inverter 63 is connected to node NCOMi, and the output node of the inverter 63 is connected to node COMi. MOS transistor 64 resets latch 55, the drain of MOS transistor 64 is connected to node NCOMi, the source is grounded, and a control signal COMH is input to the gate. For example, signal COMH is shared by detection units 50-0 to 50-*m*, and signal COMH is provided by the controller 40.

Latch 56 retains output Q(i−1) of preceding detection unit 50-(*i*−1). That is, latch 56 includes inverters 65 and 66 and n-channel MOS transistors 67 and 68. The input node of the inverter 65 is connected to a node NQLi, and the output node of the inverter 65 is connected to a node QLi. The input node of the inverter 66 is connected to node QLi, and the output node of the inverter 66 is connected to node NQLi. MOS transistor 68 has a function of storing signal Q(i−1) in latch 56, the drain of MOS transistor 68 is connected to node NQLi, the source is grounded, and signal Q(i−1) is input to the gate. However, in the detection unit 50-0 at the initial stage, signal SCANSTART is provided instead of signal Q(i−1). MOS transistor 67 resets latch 56, the drain of MOS transistor 67 is connected to node QLi, the source is grounded, and a control signal QRST is input to the gate. For example, signal QRST is shared by detection units 50-0 to 50-*m*, and signal QRST is provided by the controller 40.

The reset unit 57 is used to reset node COMi. That is, the reset unit 57 includes n-channel MOS transistors 69 and 70. The drain of MOS transistor 69 is connected to node NCOMi, the source is connected to the drain of MOS transistor 70, and the gate is connected to node QLi. The source of MOS transistor 70 is grounded, and the control signal SCANRST is provided to the gate. For example, signal SCANRST is shared by detection units 50-0 to 50-$m$, and signal SCANRST is provided by the controller 40.

The AND gate 51 performs the AND operation of the signal at node COMi and the output of the AND gate 51 of preceding detection unit 50-($i$–1). The AND gate 51 outputs the operation result as signal Qi to subsequent detection unit 50-($i$+1). As described above, the (m+1) AND gates 51 are connected in series, and referred to as the failure search chain.

2.2 Operation of Detection Unit 50

The operation of the detection unit 50 having the above configuration will be described below. Detection unit 50-0 in the case that bit line BL($8i$) is selected (in the case that bit lines BL0, BL8, BL16, . . . , BL(k–7) are selected) will be described by way of example.

Figure 4:
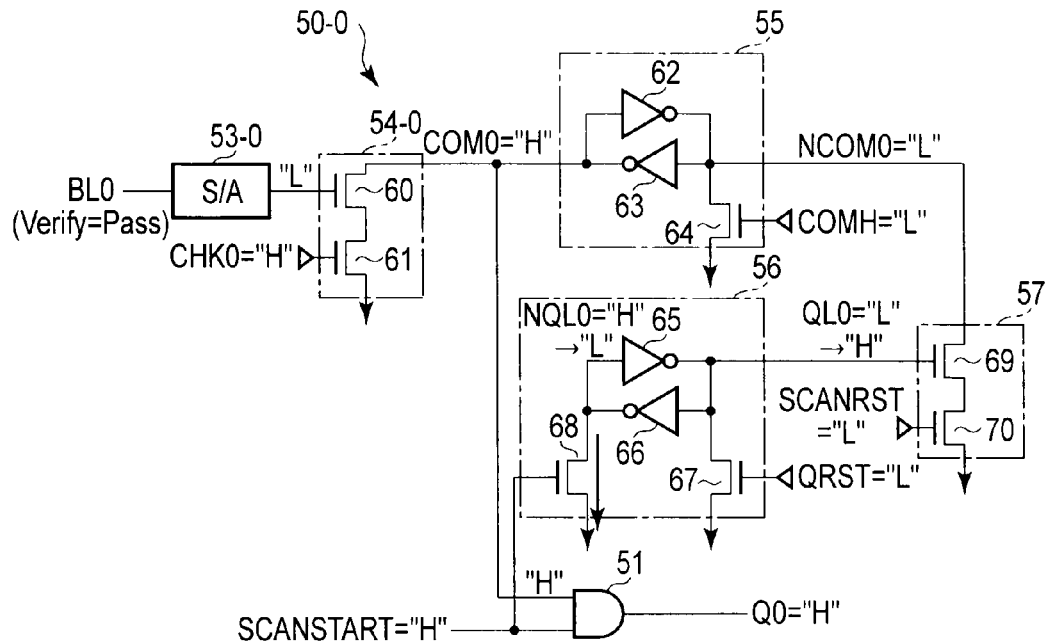

The case of passing the verification will be described with reference to FIG. 4. FIG. 4 is a circuit diagram of detection unit 50-0.

Latches 55 and 56 are reset, node COM0 is made high, and node QL0 is made low. At this point, in order to select bit line BL0, the controller 40 makes signal CHK0 high to turn MOS transistor 61 of selection unit 54-0 on. The controller 40 makes other signals CHK1 to CHK7 low to turn MOS transistors 61 of selection units 54-1 to 54-7 off (not illustrated).

In the case that the bit line BL passes the verification, the sense amplifier 53-0 outputs a low signal as the pass/failure information. Accordingly, MOS transistor 60 turns off. Therefore, node COM0 is kept high.

As illustrated in FIG. 4, signal SCANSTART is made high, whereby the operation result of the AND gate 51 goes high (Q0=High). In latch 56, MOS transistor 68 is turned on. Accordingly, node QL0 goes high.

The same holds true for the operations of other detection units 50-1 to 50-$m$. However, instead of signal SCANSTART, signal Q($i$–1) is input to the AND gates 51 of detection units 50-1 to 50-$m$. Accordingly, when signal Q($i$–1) is made high, the AND gates 51 of detection units 50-1 to 50-$m$ are operated similar to FIG. 4.

On the other hand, when signal Q($i$–1) is made low, the operation result of the AND gate 51 goes low irrespective of the state of node COMi (Qi=Low). In latch 56, because MOS transistor 68 is off, node QL is kept low.

Figure 5:
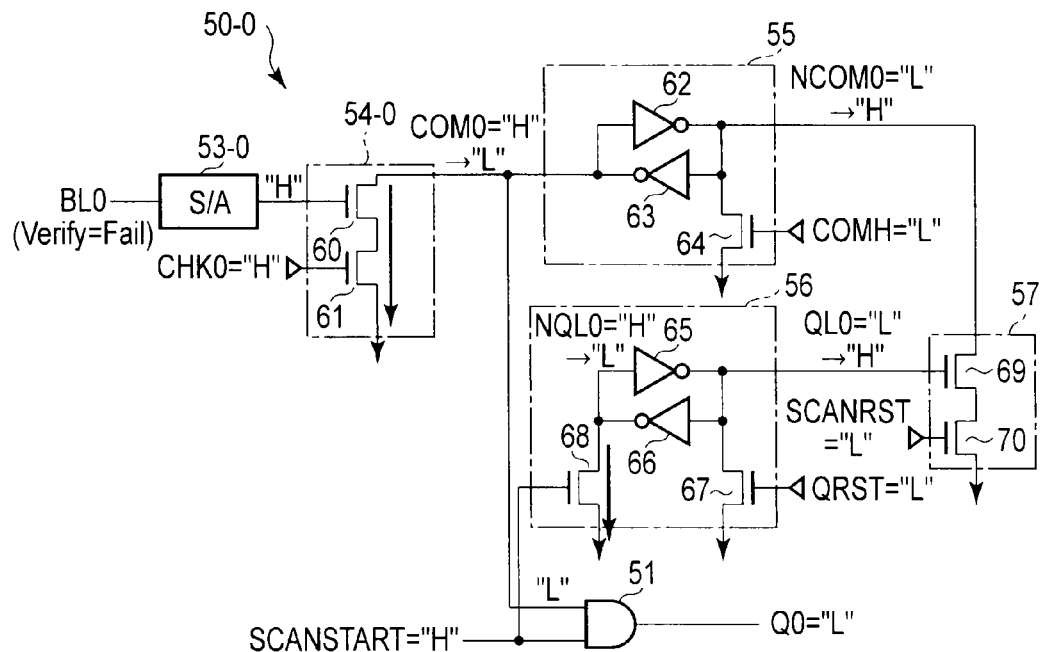

The case of failing the verification will be described with reference to FIG. 5. FIG. 5 is the circuit diagram of detection unit 50-0.

As illustrated in FIG. 5, in the case that the bit line BL fails the verification, the sense amplifier 53-0 outputs a high signal as the pass/failure information. Accordingly, MOS transistor 60 turns on. Therefore, node COM0 is grounded through MOS transistors 60 and 61, and goes low.

As illustrated in FIG. 5, even if signal SCANSTART (signal Q($i$–1) for detection units 50-1, 50-2, . . . from the second stage) is made high, the operation result of the AND gate 51 goes low (Q0=Low) because node COM0 is made low. The operation of latch 56 is identical to that of FIG. 4. That is, signal SCANSTART is made high, whereby node QL0 goes high. Latches 56 of the detection units 50 from the second stage depend on signal Q($i$–1) as described above.

2.3 Operation of Failure Search Chain 52

The operation of the failure search chain 52 included in the detector 20 will be described below.

The case in which the verify-failed bit does not exist in any columns will be described with reference to FIG. 6. FIG. 6 is a block diagram of the detector 20 when one of signals CHK0 to CHK7 is made high.

As illustrated in FIG. 6, all nodes COM go high. Accordingly, when signal SCANSTART is made high, all the AND operation results go high, and signal SCANEND goes high. The controller 40 can recognize that the verify-failed bit does not exist by receiving signal SCANEND.

The case in which the verify-failed bit exists in one of the columns will be described with reference to FIG. 7. FIG. 7 is the block diagram of the detector 20 and illustrates the case in which the verify-failed bit exists in column C1 (one of bit lines BL8 to BL15) by way of example.

As illustrated in FIG. 7, although signal Q0 goes high, signal Q1 corresponding to column C1 in which the verify-failed bit exists goes low. In all detection units 50-2 to 50-$m$ associated with columns C2 to Cm from column C1, signal Qi goes low, and signal SCANEND goes low. The controller 40 can recognize that the verify-failed bit exists in one of the columns by receiving signal SCANEND which has been made low.

Thus, the failure search chain 52 sequentially transfers the information indicating the presence or absence of the verify-failed bit as signal Q. At this point, when the verify-failed bit does not exist in any column, all the AND gates 51 sequentially transfer the signal (in the first embodiment, high) indicating "absence of verify-failed bit". On the other hand, when the verify-failed bit exists in one of the columns, the AND gates from the column in which the verify-failed bit exists sequentially transfer the signal (in the first embodiment, low) indicating "presence of verify-failed bit". That is, the logic level of signal Q (in other words, the meaning indicated by signal Q) is inverted at the boundary of the column in which the verify-failed bit exists. However, in the case that the verify-failed bits exist in the plurality of columns, the column that becomes the boundary is one that corresponds to the detection unit 50 located on the front stage side of the failure search chain 52. That is, the column that becomes the boundary is one, in which i is the smallest in columns Ci in which the verify-failed bits exist.

3. Write Operation of NAND Flash Memory 1

The data write operation of the NAND flash memory 1 according to the first embodiment will be described below.

3.1 Program Sequence

A rough flow of the data write operation will be described with reference to FIG. 8. FIG. 8 is a timing chart illustrating the program sequence of the NAND flash memory 1.

As illustrated in FIG. 8, when a program command is issued from the outside, the NAND flash memory 1 becomes a busy state to start the program sequence. A first data program is performed to the memory cell transistor MT in units of pages by performing the program operation. Then the verification operation is performed. In the verification operation, the data is internally read with respect to the programmed memory cell transistor MT, and information (pass/failure information) indicating whether the program is sufficiently performed is stored in the sense amplifier 53.

The detecting operation is performed when the verification operation is ended. On the detecting operation, the pass/failure information stored in the sense amplifier 53 by the verification is read onto node COM to count the number of verify-failed bits. Hereinafter the program operation, the verification operation, and the detecting operation are collectively referred to as a program period.

As a result of the detecting operation, the controller 40 performs the second program period when the number of verify-failed bits exceeds an allowable number, and the controller 40 exits from the program sequence to return to a ready state when the number of verify-failed bits is the allowable number or less.

With the advance of the large capacity and microfabrication, when the sufficient program is performed to all the memory cell transistors, the number of repetitions of the program period becomes enormous, and a time necessary for the program sequence is increased. Therefore, a pseudo-pass function is adopted in the NAND flash memory 1 of the first embodiment. That is, because a bit error can be relieved by an ECC technology when the number of bit errors is a predetermined allowable number or less, the program sequence is ended even if the write operation is incompletely performed. Therefore, a speed of the program time is enhanced.

A circuit technology of counting the number of bits of the memory cell transistors that become verify-failed as a result of the verification is required to implement the pseudo-pass function. The detector 20 implements the pseudo-pass function.

3.2 Detailed Program Sequence

The detailed program sequence will be described below with reference to FIG. 9. FIG. 9 is a flowchart of the data write operation of the NAND flash memory 1 and focuses attention on processing of implementing the pseudo-pass function.

(Step S10)

The program operation is performed in Step S10. This operation can be performed by a well-known method.

(Step S20)

The verification operation is performed in Step S20. This operation can also be performed by a well-known method. In the verification, the data is internally read with respect to the memory cell transistor MT to which the program is performed. The verification result (pass/failure information) is stored in the sense amplifier 53 that is provided according to each bit.

(Step S30)

The detecting operation is performed in Step S30. In the detecting operation, the pass/failure information is transferred from the sense amplifier 53 to node COM, the counter 30 counts the number of verify-failed bits, and the number of verify-failed bits is compared to a predetermined bit error allowable number. The detecting operation is performed as follows.

Latches 55 and 56 are reset (Step S31). For example, the controller 40 asserts signals COMH and QRST (in the first embodiment, signals COMH and QRST are made high). As a result, MOS transistors 64 and 67 are turned on in all the detection units 50, node COM is made high (NCOM=Low), and node QL is made low (NQL=High). The operation in Step S31 may be performed prior to Steps S10 and S20, the operation in Step S31 may be performed at the same time as Steps S10 and S20 are performed, or the operation in Step S31 may be performed any time before the pass/failure information is read onto node COM.

A count value j of the counter 30 is reset (j=0), and signal CHK0 is selected (h=0) (Step S32). The reset operation of the counter 30 may also be performed any time before the pass/failure information is read onto node COM.

The pass/failure information is read from the sense amplifier 53-*h* (in this case, the sense amplifier 53-0 because of h=0) to node COM. That is, the sense amplifiers 53-0 to 53-7 output the pass/failure information to the gates of MOS transistors 60. The controller 40 asserts signal CHKh (in this case, signal CHK0 because of h=0) (in the first embodiment, signal CHKh is made high) to turn MOS transistor 61 of selection unit 54-0 on. As a result, the logic level at node COM changes according to the pass/failure information on the sense amplifier 53-0. Specifically, node COM is kept high in the case of passing the verification, and node COM goes low in the case of verify-failing the verification (Step S33).

The controller 40 asserts signal SCANSTART (in the first embodiment, signal SCANSTART is made high) to start counting the number of verify-failed bits (Step S34).

As a result of making signal SCANSTART high, when signal SCANEND is made low (NO in Step S35), the verify-failed bit exists in at least one of the columns.

Therefore, the controller 40 makes signal SCANSTART low (Step S36). Then the controller 40 asserts signal SCANRST (in the first embodiment, signal SCANRST is made high) to reset latch 55 (node COM) (Step S37). At this point, in the detection unit 50, latch 55 is reset only when initially low node QL of latch 56 goes high. As described above, the data retained by latch 56 is inverted by turning MOS transistor 68 on. In Step S34, in the detection unit 50 that cannot receive a high signal Q(i−1), MOS transistor 68 is kept off and latch 56 continuously retains the initial state. Therefore, latch 55 is not reset in the detection unit 50. Node COM goes high in the detection unit 50 in which latch 55 is reset.

The counter 30 increments the count value by one (Step S38). That is, j=j+1. Then the controller 40 determines whether the number of verify-failed bits is a predetermined verify-failed bit allowable number or less (Step S39). For example, the allowable number is the maximum number of bits that can be relieved by the ECC technology.

When the number of verify-failed bits j is the allowable number or less (YES in Step S39), the controller 40 makes signal SCANRST low (Step S40), and returns to Step S34. That is, signal SCANSTART is made high again to start counting the number of failed bits. In the counting from the second time, node COM of the detection unit 50 associated with the previously-counted verify-failed bit is already reset in Step S37. Accordingly, in the counting from the second time, the AND gate 51 of the detection unit 50 outputs a high signal even if the detection unit 50 corresponds to the verify-failed bit.

When the number of verify-failed bits j exceeds the allowable number (NO in Step S39), the controller 40 determines whether the number of repetitions (the number of loops) of the program period of the data is a specified number or less. When the number of repetitions is the specified number or less (NO in Step S41), the controller 40 returns to Step S10 to perform the next program period. That is the controller 40 repeats the program operation, the verification operation, and the detecting operation to the data.

On the other hand, when the number of loops exceeds the specified number (YES in Step S41), the program operation becomes failure, and the controller 40 ends the program sequence.

When signal SCANEND is made high (YES in Step S35), in each of the columns, the verify-failed bit does not exist in the bit line BL selected by signal CHKh.

Then the controller 40 makes signal SCANRST low (Step S42), and acknowledges whether the detecting operation is performed to all the bit lines BL. That is, the controller 40 determines whether h is 7 (Step S43). When h is not 7 (NO in Step S43), the controller 40 sets h to h+1, returns to Step S33 to issue signal CHKh again, and repeats the operations in Steps S33 to S40 (Step S44).

When h is 7 (YES in Step S43), the detecting operation is ended in all the bit lines BL with respect to each column. Accordingly, the controller 40 regards the count value j of the counter 30 at this point as the total number of verify-failed bits (Step S45).

Then the controller 40 determines whether the number of verify-failed bits j is lower than the predetermined verify-failed bit allowable number (Step S46). Step 46 is identical to the determination processing in Step S39.

When the number of verify-failed bits j is the allowable number or less (YES in Step S46), the controller 40 determines that the data can normally be written, and ends the program sequence.

On the other hand, when the number of verify-failed bits j exceeds the allowable number (NO in Step S46), the controller 40 goes to the processing in Step S41. That is, the controller 40 determines whether the number of repetitions (the number of loops) of the program period of the data is the specified number or less. When the number of repetitions is the specified number or less (NO in Step S45), the controller 40 returns to Step S10. When the number of loops exceeds the specified number (YES in Step S45), the program operation becomes failure, and the controller 40 ends the program sequence.

The determination in Step S46 may be eliminated. This is because the processing in Step S39 is already performed at the time the flow goes to Steps S45 and S46, and the affirmative determination is made in Step S43, that is the determination that the number of verify-failed bits is the allowable number or less is made at that time. Accordingly, at the time the determination that h is 7 is made in Step S43, the write operation may normally be performed to end the program sequence.

3.3 Specific Example of Detecting Operation

Specific examples of the detector 20 and the counter 30 during the detecting operation will be described below with reference to FIGS. 10 to 16. FIG. 10 is a timing chart of various signals and the count value j during the detecting operation, and FIGS. 11 to 16 are block diagrams of the detector 20 and the counter 30.

For the sake of convenience, the case in which the detector 20 includes the five detection units 50-0 to 50-4 (m=4) will be described below. The operations when signals CHK0 to CHK7 are made high are identical to one another. Therefore, attention is focused on the operation in which signal CHK0 is made high, and the case in which the verify-failed bits exist in column C2 (BL8) and column C3 (BL24) at this point will be described by way of example.

After the program operation and the verification operation, the controller 40 makes signals COMH and QRST high (Step S31, before a time t0 of FIG. 10, FIG. 11). As a result, in all the detection units 50, nodes COM are made high and node QL goes low as illustrated in FIG. 11.

The controller 40 makes signal CHK0 high (Step S33, time t0 of FIG. 10, FIG. 12). As a result, the items of pass/failure information on bit lines BL0, BL8, BL16, BL24, and BL32 are read onto nodes COM0 to COM4. Because bit lines BL8 and BL24 are verify-failed, the logic levels of nodes COM1 and COM3 go low.

At a time t2, the controller 40 makes signal SCANSTART high (Step S34, FIG. 12). Therefore, in detection unit 50-0, output signal Q0 of the AND gate 51 goes high, and node QL0 goes high because MOS transistor 68 is turned on. In detection unit 50-1, because node COM1 is low, output signal Q1 of the AND gate 51 stays low. However, because output signal Q0 is high, node QL1 goes high. Because output signal Q1 is made low, output signals Q2 and Q3 and signal SCANEND stay low (NO in Step S35). That is, the signal propagating in the failure search chain 52 is inverted at the boundary of column C1.

At a time t3, the controller 40 makes signal SCANSTART low (Step S36). The controller 40 makes signal SCANRST high at a time t4 after a given waiting time Δt since signal SCANSTART has been made low (Step S37, FIG. 13). The waiting time Δt is set to at least a length of a propagation delay in the failure search chain 52. In detection units 50-0 and 50-1, the reset unit 57 becomes a conduction state to ground nodes NCOM0 and NCOM1 as illustrated in FIG. 13. As a result, node COM1 is inverted to go high. That is, the data retained by latch 55 of detection unit 50-1 changes from "failure" to "pass". In detection units 50-2 to 50-4, because nodes QL2 to QL4 are low, the information retained by latch 55 does not change.

When signal SCANEND is low, the counter 30 is incremented (j=1, at time t4, Step S38).

The controller 40 compares the number of counts j (=1) to the allowable number. When the number of counts j is the allowable number or less (YES in Step S39), the controller 40 makes signal SCANRST low once more (Step S40) to start the counting again.

At a time t5, the controller 40 makes signal SCANSTART high (Step S34, FIG. 14). Therefore, in detection unit 50-0, output signal Q0 of the AND gate 51 goes high. In detection unit 50-1, because latch 55 is reset during times t4 and t5, output signal Q1 of the AND gate 51 goes high. In detection unit 50-2, output signal Q0 of the AND gate 51 goes high, and node QL2 goes high. In detection unit 50-3, because node COM3 is low, output signal Q3 stays low. However, because output signal Q2 is high, node QL3 goes high. Because output signal Q3 is low, signal SCANEND stays low (NO in Step S35).

Thus, the high propagates sequentially from Q0 to Q1, Q1 to Q2, . . . . However, at this point, a delay is generated in the AND gate 51. The waiting time Δt is a time necessary for the high output signal Q0 to propagate to signal SCANEND.

At a time t6, the controller 40 makes signal SCANSTART low (Step S36). At a time t7, the controller 40 makes signal SCANRST high (Step S37, FIG. 15). As a result, node COM3 is reset similarly to FIG. 13. That is, the data retained by latch 55 of detection unit 50-3 changes from "failure" to "pass".

When signal SCANEND is low, the counter 30 is incremented (j=2, at time t7, Step S38).

The controller 40 compares the number of counts j (=2) to the allowable number. When the number of counts j is the allowable number or less (YES in Step S39), the controller 40 makes signal SCANRST low once more (Step S40) to start the counting again.

At a time t8, the controller 40 makes signal SCANSTART high (Step S34, FIG. 16). Therefore, the operation results of all the AND gates 51 go high, and signal SCANEND goes high (YES in Step S35).

The above instances of processing are performed while signal CHK0 (h=0) is selected (NO in Step S43). Therefore, the controller 40 sets h to 1 (Step S44) to return to Step S33, and the controller 40 repeats the same instances of processing. More specifically, signal CHK1 is made high, and the instances of processing at times t0 to t10 of FIG. 10 are repeatedly performed on bit lines BL1, BL9, BL17, BL25, and BL33. During the repetition, the count value j is not reset, but accumulates the number of verify-failed bits. The instances of processing are repeated from signal CHK1 to signal CHK7. That is, the instances of processing at times t1 to t10 of FIG. 10 are performed eight times in total.

In the above procedure, when the number of verify-failed bits is the allowable number or less with respect to all the columns while the number of program loops does not exceed the specified number, the controller 40 determines that the program is successfully performed at that time, and ends the program sequence.

4. Effect of First Embodiment

As described above, according to the configuration of the first embodiment, the accuracy of the verify-failed bit counting performed by the detector 20 can be improved. The effect will be described in detail below.

The NAND flash memory includes the detector that detects whether the write operation and the erase operation are completed for the memory cell. For example, a current detecting type counter (comparative example 1) in which an operational amplifier is used is conceivable as the detector.

Figure 17:
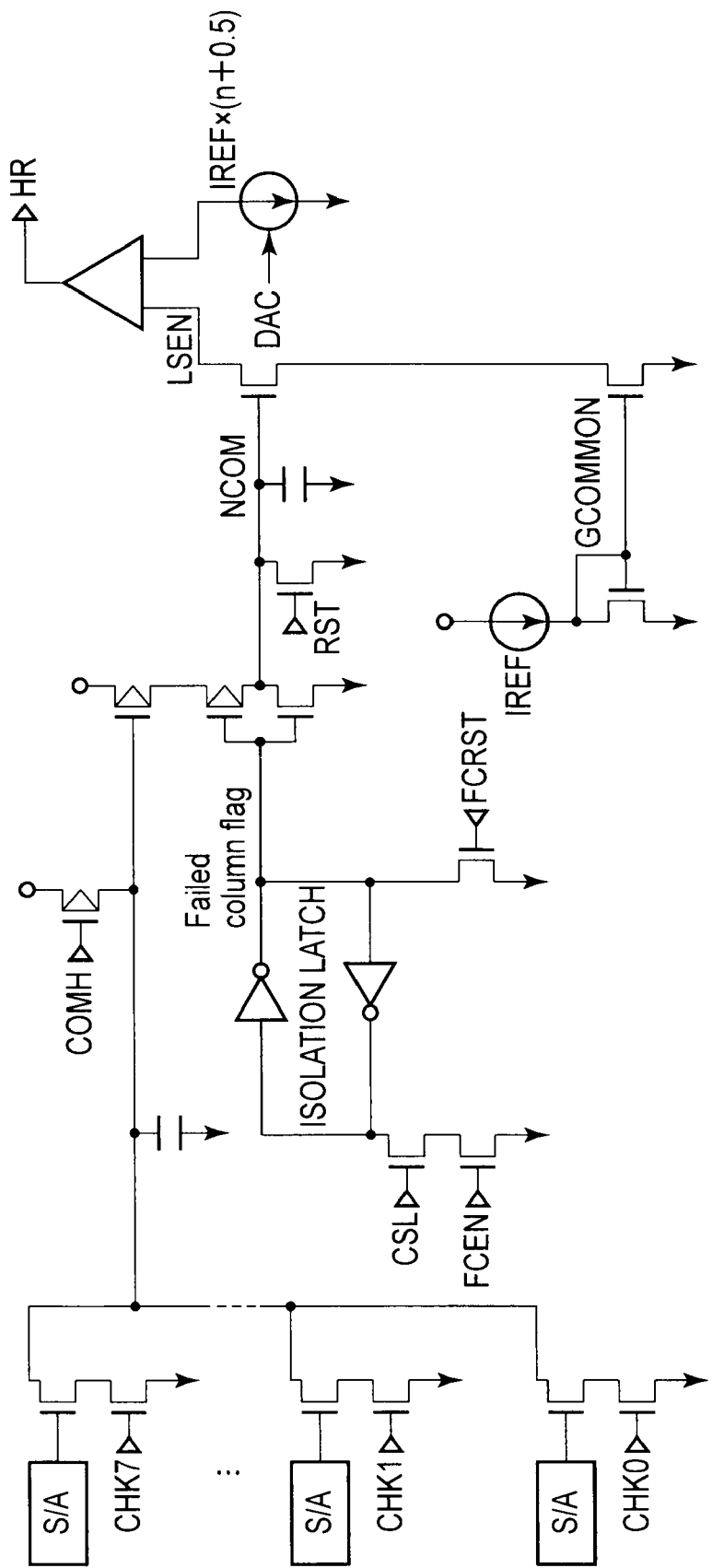
FIG. 17 is a circuit diagram of a circuit that counts a failed bit.

FIG. 17 is a circuit diagram of the current detecting type counter. In the configuration of FIG. 17, a node LSEN is connected to one of input terminals of the operational amplifier, and a reference current source is connected to the other input terminal. A current of IREF×(n+0.5) is passed through the reference current source in accordance with a D/A converter DAC (n=0, 1, 2, . . . ). A current mirror circuit is formed by a node GCOMMON, and a current IREF is passed through the current mirror circuit. A current is passed through node LSEN according to node NCOM to which the pass/failure information is provided, and node LSEN is commonly connected to all the columns.

When the number of verify-failed bits is counted, signal CHK0 is made high. Therefore, a current (IREF×n) is passed through node LSEN in accordance with the number of verify-failed bits n in the bit lines selected by signal CHK0. When the current value of the reference current source is increased by (IREF×0.5), (IREF×1.5), (IREF×2.5), . . . , an output signal HR of the operational amplifier is inverted at (IREF×(n+0.5)). Therefore, the number of verify-failed bits is obtained by referring to the value of DAC when output signal HR is inverted. The number of verify-failed bits of all the bit lines can be counted by repeating the processing from signal CHK0 to signal CHK7.

However, in the method of FIG. 17, the number of verify-failed bits is counted by detecting the current passed through node LSEN. That is, the number of verify-failed bits is counted with the analog circuit. Accordingly, the counting is largely influenced by a noise and a variation in element. Therefore, there is a risk that detection accuracy is insufficiently obtained.

Because the counting is easily influenced by the noise, it is difficult to operate the circuit at the same time as access (such as read, write, and erase) is obtained to a core of the NAND flash memory. This is because operation accuracy of the circuit is degraded by the noise generated during the access to the core. It is necessary to provide a time dedicated to the verify-failed bit detecting independently of the access to the memory cell array, and therefore the operating speed of the NAND flash memory is decreased.

The current mirror circuit is used in FIG. 17. However, many transistors that share node GCOMMON exist widely in the core, and there is a large variation among the transistors. The detectable number of bits is restricted by the variation in transistor (size and performance).

Thus, in order to increase the number of bits that can be detected, it is necessary that the variation be suppressed by enlarging a gate area of the transistor, or it is necessary to increase a gate voltage (IREF is increased or a gate length is increased). However, in each case, the area is enlarged to increase a consumption current. That is, in the method of FIG. 17, there is a limitation to the detecting accuracy in the fixed area and consumption current.

On the other hand, the above problems can be solved in the semiconductor memory device of the first embodiment. According to the configuration of the first embodiment, the presence or absence of the verify-failed bit is provided by the logic level (high or low) of signal SCANEND. The digital counter 30 counts the number of times at which signal SCANEND is at the logic level indicating "presence of verify-failed bit". Accordingly, the configuration of the first embodiment is hardly influenced by the noise or the variation in element, and the detecting accuracy can be improved.

Because of an excellent noise-resistant property, the detector 20 can be operated at the same time as the access to the core is obtained. The data read operation and the detecting operation can simultaneously be performed, or the data program operation and the detecting operation can simultaneously be performed. As a result, in the first embodiment, high-speed detecting operation can be performed compared with the case in which the data program operation and the detecting operation are separately performed.

Unlike the analog circuit, it is not necessary to increase the element size or the operation voltage in order to improve the operation accuracy. That is, advantageously the improvement of the detecting accuracy and the improvement of the detecting speed are obtained while the increase in area and the increase in chip area are suppressed.

Second Embodiment

A semiconductor memory device according to a second embodiment will be described below. The second embodiment has a redundancy function in addition to the first embodiment. Only the points different from those of the first embodiment will be described below.

1. Configuration of NAND Flash Memory 1

A configuration of a NAND flash memory 1 of the second embodiment will be described. In the configuration of the second embodiment, one of columns in a memory cell array 10 is prepared as a redundant column. In the case that one of the columns becomes defective, a controller 40 replaces the defective column with the redundant column. Therefore, the defective column is relieved.

A detector 20 will be described below. FIG. 18 is a circuit diagram of one of detection units 50-$i$ ($i$ is an integer of 0 to m, as described above) of the second embodiment. As illustrated in FIG. 18, detection unit 50-$i$ further includes a latch circuit 58 and a switch unit 59 in the configuration of the first embodiment of FIG. 3.

Latch 58 retains information indicating whether the associated column is the column, such as the defective column, which should be removed (isolated) from the detecting target. Latch 58 includes inverters 71 and 72 and n-channel MOS transistors 73 to 75.

An output node of the inverter 71 is connected to a node ISOi ($i$ is an integer of 0 to m), and an input node of the inverter 71 is connected to a node NISOi. The input node of the inverter 72 is connected to node ISOi, and the output node of the inverter 72 is connected to node NISOi. MOS transistor 73 resets latch 58, a drain of MOS transistor 73 is connected to node ISOi, a source is grounded, and a control signal FCRST is input to a gate. For example, signal FCRST is shared by detection units 50-0 to 50-$m$, and signal FCRST is provided by the controller 40. MOS transistor 74 selects the column, the drain of MOS transistor 74 is connected to node ISOi, the source is connected to the drain of MOS transistor 75, and a control signal CSLi is input to the gate. For example, signal CSLi is provided in each column Ci by the controller 40. MOS transistor 75 writes the information indicating that the column is the isolation target to latch 58, the source of MOS transistor 75 is grounded, and a control signal FCEN is input to the gate. Hereinafter the information indicating that the column is the isolation target is referred to as isolation information. For example, signal FCEN is shared by detection units 50-0 to 50-*m*, and signal FCEN is provided by the controller 40.

A switch unit 59 will be described below. As illustrated in FIG. 18, the switch unit 59 includes n-channel MOS transistors 76 and 78 and p-channel MOS transistor 77 and 79.

In each of MOS transistors 76 and 77, one of the source and the drain is connected to an output node of an AND gate 51, and signal Qi is output from the other. The gates of MOS transistors 76 and 77 are connected to nodes NISOi and ISOi, respectively. In each of MOS transistors 78 and 79, signal Q(i−1) is input to one of the source and the drain (in the case of detection unit 50-0, signal SCANSTART), and signal Qi is output from the other. The gates of MOS transistors 78 and 79 are connected to nodes ISOi and NISOi, respectively.

2. Operation of Detector 20

The operation of the detector 20 having the above configuration will be described below with reference to FIG. 18.

In the initial state of latch 58, node ISOi is made low and node NISOi is made high. The latch 58 in the initial state indicates that the associated column Ci is not the isolation target. The signal FCRST is made high to turn on MOS transistor 73, thereby writing the information indicating that the associated column Ci is not the isolation target to latch 58.

In the case that one of the columns is the isolation target, the controller 40 writes the information (defective information) to latch 58. The controller 40 makes signal FCEN high. Therefore, MOS transistors 75 of all the detection units 50 turn on. The controller 40 makes signal CSLi of detection unit 50-*i* associated with the column of the isolation target high. In detection unit 50-*i*, MOS transistors 74 and 75 turn on, node NISOi goes low, and node ISOi goes high. Therefore, the isolation information is written to latch 58. More specifically, assuming that column C1 is the isolation target, signal CSL1 is made high. Therefore, node ISO1 is made high, and node NISO1 is made low.

As a result, in detection unit 50-*i* in which the isolation information is written, MOS transistors 76 and 77 of the switch unit 59 are turned off, and MOS transistors 78 and 79 turn on. In detection unit 50-*i*, signal Q(i−1) received from preceding detection unit 50-(*i*−1) is directly output as signal Qi to subsequent detection unit 50-(*i*+1). That is, the AND gate 51 of detection unit 50-*i* is bypassed. Therefore, the detection result of the detection unit 50 associated with the column of the isolation target can be skipped in a failure search chain 52.

In the detection unit 50 associated with the column that is not the isolation target, because MOS transistors 76 and 77 turn on while MOS transistors 78 and 79 turn off, the same operation as the first embodiment is performed.

3. Effect of Second Embodiment

As described above, according to the configuration of the second embodiment, similarly to the first embodiment, the accuracy of the verify-failed bit counting performed by the detector 20 can be improved. Additionally, according to the configuration of the second embodiment, the AND gate 51 can be bypassed according to the information in latch 58. That is, the column such as the defective column to be removed from the detecting target can be removed from the target of the verify-failed bit counting. Accordingly, the configuration of the first embodiment can be applied to the NAND flash memory having the redundancy function.

Third Embodiment

A semiconductor memory device according to a third embodiment will be described below. The third embodiment further provides a test circuit in the second embodiment. Only the points different from those of the second embodiment will be described below.

1. Configuration of Detection Unit 50

Figure 19:
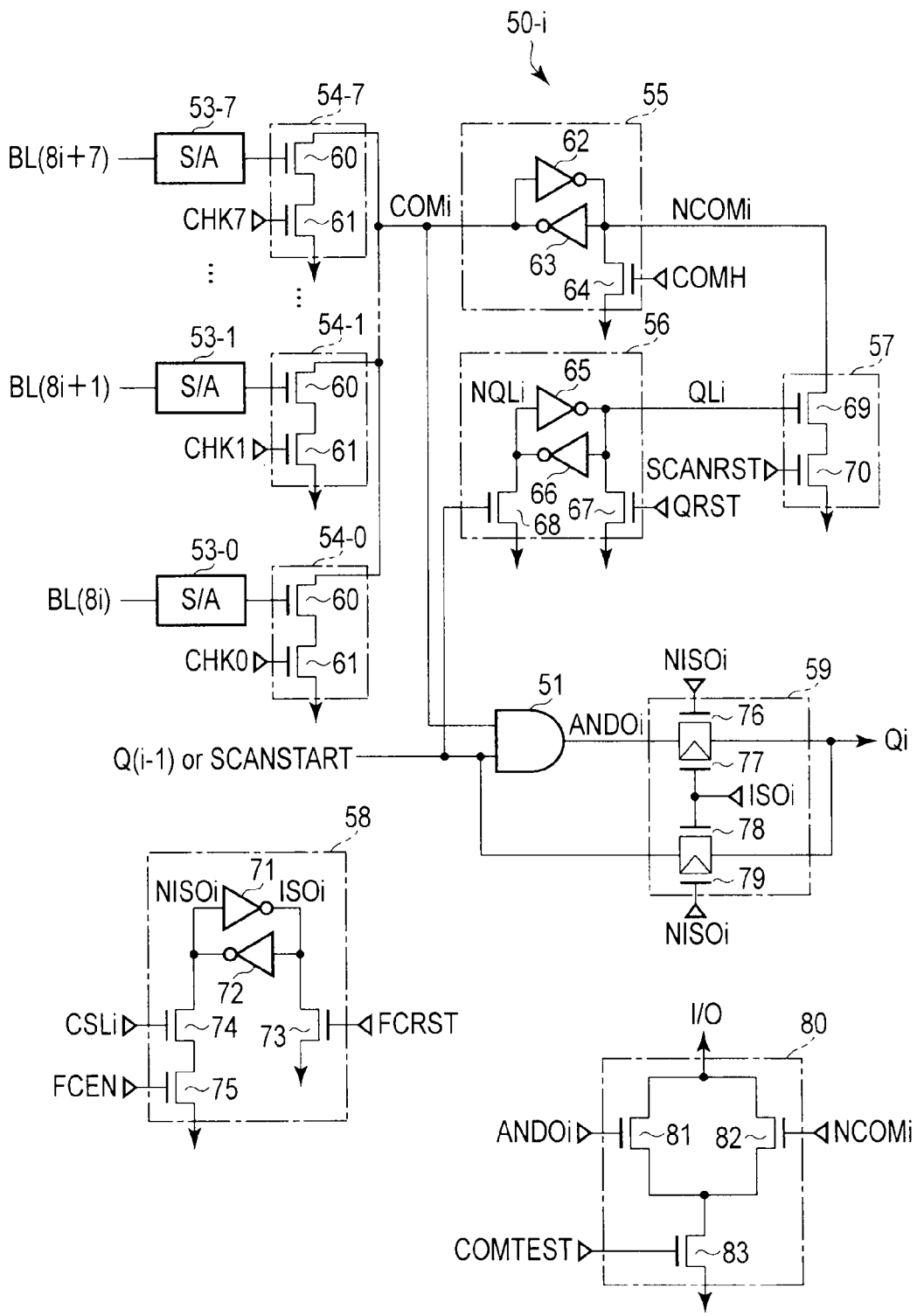
FIG. 19 is a circuit diagram of a detector, a latch circuit, and a test circuit according to a third embodiment.

FIG. 19 is a circuit diagram of a detection unit 50-*i* of the third embodiment. As illustrated in FIG. 19, detection unit 50-*i* further includes a test circuit 80 in the configuration of the second embodiment of FIG. 18.

The test circuit 80 includes n-channel MOS transistors 81 to 83. A drain of MOS transistor 81 is connected to an input/output unit (I/O) of a NAND flash memory 1, and an output node ANDOi (i is an integer of 0 to m) of an associated AND gate 51 is connected to a gate of MOS transistor 81. The drain of MOS transistor 82 is connected to the input/output unit, and an associated node NCOMi is connected to the gate. The drain of MOS transistor 83 is connected to sources of MOS transistors 81 and 82, the source of MOS transistor 83 is grounded, and a control signal COMTEST is input to the gate of MOS transistor 83. For example, signal COMTEST is asserted (high) when the detection unit 50 is tested, and signal COMTEST is provided by a controller 40.

2. Test Operation of Detection Unit 50

A test operation of the detection unit 50 will be described below. In the test operation, the controller 40 asserts the test signal COMTEST to turn MOS transistor 83 on. High or low is output to the input/output unit according to the logic levels at nodes COMi and ANDOi.

A specific example of the test operation will be described below. For example, it is assumed that a defect in which node COM0 is held low is generated. In this case, the controller 40 makes signal COMH high to reset a latch circuit 55. Then the controller 40 makes signal COMH low again.

In the normal state, node NCOM0 goes low and node COM0 goes high. Because signal SCANSTART is low, node ANDO0 also goes low. Accordingly, MOS transistors 81 and 82 turn off, and a high is output to the input/output unit.

However, when node COM0 is held low, node COM0 is made high by an inverter 62. Therefore, MOS transistor 82 turns on, and a low is observed in the input/output unit.

3. Effect of Third Embodiment

According to the configuration of the third embodiment, various defects at various nodes can be found.

Usually, the signals at nodes COM and ANDO of the detection unit 50 cannot be observed from the outside. On the other hand, in the third embodiment, the test circuit 80 is provided to be able to take out the states at the nodes to the outside. The states are output to a built-in self-test (BIST) circuit to be able to detect the defect or specify the defective column.

In the third embodiment, the defect in which node COM is held low is described by way of example. A defect in which node COM is held high and a defect in which a node QL is held low or high can similarly be found.

In the third embodiment, the signals at nodes NCOM and ANDO are input to the test circuit 80 by way of example. Alternatively, the signal at another node may be input to the test circuit 80. The signal input to the test circuit 80 may properly be selected according to the signal to be detected.

Fourth Embodiment

A semiconductor memory device according to a fourth embodiment will be described below. The fourth embodiment replaces the AND gate 51 of the third embodiment with a three-input AND gate. Only the points different from those of the third embodiment will be described below.

1. Configuration of Detection Unit 50

FIG. 20 is a circuit diagram of a detection unit 50-*i* of the fourth embodiment. As illustrated in FIG. 20, in detection unit 50-*i*, the AND gate 51 is replaced with the three-input AND gate in the configuration of the third embodiment of FIG. 19, and signal SCANSTART is additionally input. The AND gate of detection unit 50-*i* performs the AND operation of the logic level at a node COMi, signal Q(i−1), and signal SCAN-START.

A first-stage detection unit 50-0 may be constructed by the same two-input AND gate as the third embodiment, and detection unit 50-0 performs the AND operation of the logic level at a node COM0 and signal SCANSTART.

2. Operation of Detector 20

An operation of a detector 20 will be described below with reference to FIG. 21. FIG. 21 is a timing chart of various signals during the detecting operation, and corresponds to the case of the first embodiment of FIG. 10.

As illustrated at times t5 and t7 in FIG. 21, in signals Q0 to Q3 and SCANEND, a delay is generated when the signals rise. However, the delay is hardly generated when the signals fall. That is, signals Q0 to Q3 and SCANEND fall at substantially the same time that signal SCANSTART falls. This is because signal SCANSTART is used as one of the inputs in the AND operation that is performed to generate signals Q0 to Q3 and SCANEND.

3. Effect of Fourth Embodiment

According to the configuration of the fourth embodiment, the falling timing of signals Q0 to Q3 and SCANEND can substantially be matched with the falling timing of signal SCANSTART.

Therefore, the waiting time Δt (see FIG. 10) necessary to assert signal SCANRST is eliminated. At the same time as signal SCANSTART is negated (low), signal SCANRST can be asserted (see times t3 and t5 of FIG. 21) and signal COMH can also be asserted (see time t7 of FIG. 21). Accordingly, the operating speed of a NAND flash memory 1 can be enhanced.

The reason signal SCANRST is asserted after signal Q falls is that the plurality of nodes COM are prevented from being reset in the same column. For example, in the case that signal SCANRST is asserted before signal Qi falls, signal Q(i+1) goes high the instant node COMi is reset. When a node COM(i+1) is failed (low), node COM(i+1) is simultaneously reset, and it is difficult to correctly count the verify-failed bit.

Therefore, in the first embodiment, signal SCANRST is asserted after the waiting time of the gate delay. On the other hand, according to the fourth embodiment, signal Q is forced low by signal SCANSTART, so that the count operation can correctly be performed without the waiting time.

Particularly the fourth embodiment is effectively applied to the semiconductor device having a low power supply voltage.

Fifth Embodiment

A semiconductor memory device according to a fifth embodiment will be described below. In the fifth embodiment, the failure search chain 52 of the fourth embodiment is divided in units of ECC. Only the points different from those of the fourth embodiment will be described below.

1. Configuration of NAND Flash Memory 1

A configuration of a NAND flash memory 1 of the fifth embodiment will be described with reference to FIG. 22. FIG. 22 is a block diagram of the NAND flash memory 1 of the fifth embodiment.

As illustrated in FIG. 22, in the NAND flash memory 1 of the fifth embodiment, a plurality of detectors 20 and a plurality of counters 30 are provided in the configuration of FIG. 1.

A controller 40 of the fifth embodiment includes an ECC unit 41 that performs the ECC processing. For example, the ECC unit 41 performs the ECC processing in units of 512 bytes. The unit is only by way of example, and the ECC processing may be performed in units of any data size.

Each detector 20 is provided in units of the ECC processing, namely, units of 512 bytes. That is, one detector 20 is provided in each columns C0 to C511, one detector 20 is provided in each columns C512 to C1023, and one detector 20 is provided in each columns C(m-511) to Cm.

Each detector 20 includes a buffer 90 that temporarily retains the items of data read from the associated 512 columns or the items of data that should be written to the 512 columns (the set of the buffers 90 forms a page buffer of one page).

The counter 30 is provided according to each detector 20, and performs the verify-failed bit counting in response to signal SCANEND of the associated detector 20.

2. Operation of NAND Flash Memory 1

In the detecting operation, each detector 20 performs the operations of the first to fourth embodiments with respect to the associated 512 columns, and the corresponding counter 30 counts the number of verify-failed bits. The controller 40 adds the numbers of verify-failed bits of counters 30 to recognize the number of verify-failed bits existing in all the columns.

In reading the data, the controller 40 performs the ECC processing in units of items of data read to the buffer 90 of each detector 20. That is, the ECC processing is performed for a group of the items of data of columns C0 to C511 read to the buffer 90 of a certain detector 20, and the ECC processing is performed for a group of the items of data of columns C512 to C1023 read to the buffer 90 of another detector 20.

Accordingly, the number of verify-failed bits that is compared to the allowable number in Step S44 of the first embodiment of FIG. 9 is equal to or lower than the number of defective bits that can be relieved through the ECC processing with respect to the column. For example, in the case of focusing attention on columns C0 to C511, the allowable number is not the number of defective bits that can be relieved with respect to all columns C0 to Cm, but the number of defective bits that can be relieved when the ECC processing is performed to the 512 columns.

The same holds true for the data write operation. In writing the data, the controller 40 performs the ECC processing to the externally-input items of data in units of 512 bytes, and stores the items of data in each buffer 90.

There is no particular limitation to the data unit of the fifth embodiment as long as the unit can be dealt with as a bundle of items of data in some form in the ECC processing. For example, in reading the data, in the 512 byte of columns C0 to C511, the 496 bytes may be the net data while the remaining 16 bytes are parities (data generated from the net data). The 512 bytes of columns C0 to C511 may be the net data, and the parity necessary to perform the ECC processing to the net data may be read from another column (for example, C(m-511) to Cm). The same holds true for the write operation.

3. Effect of Fifth Embodiment

As described above, according to the configuration of the fifth embodiment, a failure search chain 52 is divided into the plurality of items. The divided items of the failure search chain 52 can independently be operated. The length of one failure search chain 52 can be shortened compared with the first to fourth embodiments, and the plurality of failure search chains 52 can simultaneously be performed. As a result, the time necessary for the detecting operation can significantly be shortened.

According to the fifth embodiment, in the data transfer for the ECC processing, the controller 40 and the detector 20 correspond to each other on one-to-one. That is, the controller 40 may perform the ECC processing in units of the items of data transferred from the buffer 90 of a certain detector 20, and it is not necessary to transfer the data from another detector 20 for the purpose of the ECC processing of the data for the certain detector 20. Therefore, the data can more simply be transferred in the case that the items of data can be transferred in units of ECC processing between the page buffer and the ECC unit 41. Even if the parity is read from the buffer 90 of another detector 20, because the net data is transferred in units of detectors, the data transfer does not become troublesome.

It is not always necessary that the data unit of the ECC processing corresponds to the detector 20 on one-to-one. For example, the number of columns associated with the detector 20 may be lower than the data unit of the ECC processing, or the number of columns may be ½, ⅓, or ¼ of the data unit of the ECC processing. In such cases, the number of gates in each failure search chain can be decreased by dividing the failure search chain, and the effect of the speed enhancement is obtained. The number of columns associated with each detector 20 is determined as 1/N (N: integer) in accordance with the data unit of the ECC processing, which allows the data to be simply transferred.

Modifications

As described above, the semiconductor memory device of the embodiments includes the plurality of memory cells MT, the logic gate chain 52, and the counter 30. The memory cell MT is capable of retaining the data and is associated with one of the columns. The logic gate chain 52 includes the plurality of logic gates 51 each of which is associated with one of the columns, each of the logical gates outputting a logical level to a next-stage logical gate in the series connection, the logic level indicating the presence or absence of the verify-failure in the associated column. The counter 30 counts the number of output times of the logic level indicating the presence of the verify-failure in the final-stage logic gate of the series connection. In the logic gate chain 52, a content indicated by the logic level output from each logic gate 51 is inverted at a boundary of the logic gate 51 associated with the column having the verify-failure.

According to the above configuration, the number of verify-failed bits can accurately be counted. Various modifications can be made in the embodiments. For example, in the embodiments, the failure search chain 52 is formed by the AND gates connected in series. However, the logic gate of the failure search chain 52 is not limited to the AND gate. Alternatively, other logic gates such as a NAND gate, an OR gate, and a NOR gate may be included in the failure search chain 52 or the failure search chain 52 may be formed by a combination of the plurality of kinds of logic gates.

In the embodiments, signal Q of the failure search chain 52 indicates "absence of verify-failed bit" when high, and "presence of verify-failed bit" when low. Alternatively the relationship may be reversed. Alternatively, high may indicate "absence of verify-failed bit" in a certain column while low indicates the "absence of verify-failed bit" in another column.

That is, the failure search chain 52 is not limited to the circuit configurations described in the embodiments. Namely, various configurations may be employed so long as a circuit block associates with each column is connected in series, and an output of the circuit block is inverted according to failure with the smallest column address. As used herein, "inversion" means not from high to low or from low to high, but that the content (presence or absence of the failure) indicated by the signal is inverted.

In the embodiments, signal CHK is asserted one by one by way of example. Alternatively, at least two signals CHK may be asserted. For example, when not the number of verify-failed bits, but the number of verify-failed columns is counted, all signals CHK0 to CHK7 may simultaneously be asserted.

In FIGS. 10 and 21, the counter 30 is incremented at the time signal SCANRST is asserted. However, the incrementation of the counter 30 is not limited to the time signal SCANRST is asserted. The counter 30 may be incremented at any time signal SCANEND is monitored to determine that the failure exists. The time signal SCANRST is asserted can be cited as an example of the time the counter is incremented. Alternatively, the counter may be incremented at the time signal SCANSTART is asserted (times t5 and t8 of FIG. 10). For example, the counter may be incremented in response to receipt of signal SCANRST or SCANSTART while signal SCANEND remains low. Not only the counter is incremented, but also the counter may be decremented.

It is not always necessary that the switch unit 59 or the test circuit 80 be a part of the detector 20, but the switch unit 59 or the test circuit 80 may be provided out of the detector 20.

Each embodiment may independently be implemented. That is, the third embodiment is based on the second embodiment. Alternatively, latch 58 and the switch unit 59 may be eliminated in FIG. 19. The fourth embodiment is based on the third embodiment. Alternatively, at least one of latch 58 and switch unit 59 and the test circuit 80 may be eliminated in FIG. 20.

In the embodiments, the detecting operation is performed during the data write operation by way of example. Alternatively, the detecting operation may be performed during the data erase operation. For example, after the data is erased, erase verification is performed in order to confirm whether a threshold of the memory cell transistor MT is sufficiently decreased. The embodiments can be applied to the subsequent detecting operation. There is well known a method in which the threshold of the memory cell transistor is set in a proper range by performing the write operation (also referred to as a weak program or a soft program) after the erase operation. The erase verification is performed after the write operation, and then the detecting operation is performed. The embodiments can be applied to the detecting operation. In the processing flow of the detecting operation of FIG. 19, the order can be changed as much as possible.

The n-channel MOS transistor and the p-channel MOS transistor of the embodiments can appropriately be replaced. In the embodiments, the NAND flash memory is described by way of example. Alternatively, the embodiments may be applied to a NOR flash memory, a DINOR flash memory, and an AND flash memory. In addition to the flash memory, the embodiments can be applied to general semiconductor memories such as a magnetic random access memory in which a magnetoresistive element is used as the memory cell and a resistive random access memory in which a variable resistance element is used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of memory cells each of which is capable of retaining data and is associated with one of columns;
   a logic gate chain which includes a plurality of logic gates each of which is associated with one of the columns, each of the logical gates outputting a logical level to a next-stage logical gate in the series connection, the logic level indicating presence or absence of verify-failure in the associated column; and
   a counter which counts the number of output times of the logic level indicating the presence of the verify-failure in a final-stage logic gate of the series connection,
   wherein a content indicated by the logic level output from each of the logic gates is inverted at a boundary of the logic gate associated with the column having the verify-failure in the logic gate chain.

2. The device according to claim 1, further comprising:
   a first latch circuit which is associated with one of the columns; and
   a switch which transfers an output of a preceding logic gate to a subsequent logic gate based on information in the first latch circuit.

3. The device according to claim 2, further comprising:
   a second latch circuit which is associated with one of the columns to retain information indicating the presence or absence of the verify-failure in the associated column; and
   a test circuit which is associated with one of the columns and is capable of externally outputting at least one of the output of the associated logic gate and the information retained by the second latch circuit in response to a test signal.

4. The device according to claim 3, wherein each of the logic gates performs a logic operation based on
   the information indicating the presence or absence of the verify-failure in the associated column,
   the output of the preceding logic gate, and
   a control signal asserted in performing a count operation of the number of verify-failed bits.

5. The device according to claim 4, further comprising an ECC unit which performs ECC processing to the data,
   wherein the number of columns associated with the logic gate chain is equal to or lower than a data unit of the ECC processing in the ECC unit.

6. The device according to claim 1, further comprising:
   a first latch circuit which is associated with one of the columns to retain information indicating the presence or absence of the verify-failure in the associated column; and
   a reset instruction unit which is associated with one of the columns and is capable of resetting the first latch circuit associated with the logic gate located at the boundary,
   wherein the logic gate performs a logic operation of the information in the associated first latch circuit and the output of a preceding logic gate.

7. The device according to claim 6, wherein the reset instruction unit resets the first latch circuit based on the information in the associated first latch circuit and the output of the preceding logic gate.

8. The device according to claim 1, wherein, when the verify-failure exists in one of the columns,
   all the logic gates preceding the boundary output a logic level indicating that the verify-failure does not exist, and
   all the logic gates succeeding the boundary output a logic level indicating that the verify-failure exists.

9. The device according to claim 6, wherein the reset instruction unit resets the first latch circuit when the associated first latch circuit has information indicating that the verify-failure exists and the output of the preceding logic gate indicates that the verify-failure does not exist, and
   the reset instruction unit does not reset the first latch circuit irrespective of the information on the associated first latch circuit when the output of the preceding logic gate indicates that the verify-failure exists.

10. The device according to claim 2, wherein the first latch circuit retains information indicating whether the associated column is a detecting target of the verify-failure, and
    the switch transfers the output of the preceding logic gate to the next-stage logic gate when the information indicates that the associated column is not the detecting target of the verify-failure.

* * * * *